US00RE48473E

(19) United States
(12) Reissued Patent
Lee

(10) Patent Number: US RE48,473 E
(45) Date of Reissued Patent: Mar. 16, 2021

(54) VERTICAL-TYPE NON-VOLATILE MEMORY DEVICES HAVING DUMMY CHANNEL HOLES

(71) Applicant: Samsung Electronics Co., Ltd., Suwon-si (KR)

(72) Inventor: Chang-Hyun Lee, Hwaseong-si (KR)

(73) Assignee: SAMSUNG ELECTRONICS CO., LTD., Suwon-si (KR)

(21) Appl. No.: 15/720,227

(22) Filed: Sep. 29, 2017

Related U.S. Patent Documents

Reissue of:
(64) Patent No.: 9,406,692
Issued: Aug. 2, 2016
Appl. No.: 14/588,693
Filed: Jan. 2, 2015

(30) Foreign Application Priority Data

Jan. 3, 2014 (KR) ..... 10-2014-0000838

(51) Int. Cl.
*H01L 27/115* (2017.01)
*H01L 27/11582* (2017.01)
*H01L 27/1157* (2017.01)
*H01L 27/11575* (2017.01)
*H01L 27/11565* (2017.01)

(52) U.S. Cl.
CPC .... *H01L 27/11582* (2013.01); *H01L 27/1157* (2013.01); *H01L 27/11575* (2013.01); *H01L 27/11565* (2013.01)

(58) Field of Classification Search
CPC ..... H01L 27/11582; H01L 27/1157; H01L 27/11575; H01L 27/11565
See application file for complete search history.

(56) References Cited

U.S. PATENT DOCUMENTS 7,867,831 B2 1/2011 Shin et al.
8,203,177 B2 6/2012 Shin et al.
(Continued)

FOREIGN PATENT DOCUMENTS

CN 101651144 A 2/2010
CN 101794789 A 8/2010
(Continued)

OTHER PUBLICATIONS

US 7,799,616 B2, 09/2010, Shin et al. (withdrawn)
(Continued)

*Primary Examiner* — Leonardo Andujar
(74) *Attorney, Agent, or Firm* — Muir Patent Law, PLLC

(57) ABSTRACT

A vertical-type nonvolatile memory device is provided in which differences between the sizes of channel holes in which channel structures are formed are reduced. The vertical-type nonvolatile memory device includes a substrate having channel hole recess regions in a surface thereof. Channel structures vertically protrude from the surface of the substrate on ones of the channel hole recess regions, and memory cell stacks including insulating and conductive layers are alternately stacked along sidewalls of the channel structures. A common source line extends along the surface of the substrate on other ones of the channel hole recess regions in a word line recess region, which separates adjacent memory cell stacks. Related fabrication methods are also discussed.

25 Claims, 19 Drawing Sheets

(56) References Cited

U.S. PATENT DOCUMENTS

| | | | | |
|---|---|---|---|---|
| 8,338,874 | B2 | 12/2012 | Shin et al. | |
| 8,344,385 | B2 | 1/2013 | Kim et al. | |
| 8,394,683 | B2 | 3/2013 | Ramaswamy et al. | |
| 8,461,643 | B2 | 6/2013 | Lee | |
| 8,610,193 | B2 | 12/2013 | Ramaswamy | |
| 2009/0310425 | A1 | 12/2009 | Sim et al. | |
| 2010/0163968 | A1 | 7/2010 | Kim et al. | |
| 2010/0193861 | A1* | 8/2010 | Shim | H01L 27/11556 257/329 |
| 2011/0169067 | A1 | 7/2011 | Ernst et al. | |
| 2012/0061741 | A1 | 3/2012 | Shim et al. | |
| 2012/0064682 | A1* | 3/2012 | Jang | H01L 21/28273 438/268 |
| 2012/0068247 | A1* | 3/2012 | Lee | H01L 29/7889 257/316 |
| 2012/0205722 | A1* | 8/2012 | Lee | H01L 27/11578 257/211 |
| 2012/0208347 | A1 | 8/2012 | Hwang et al. | |
| 2012/0217564 | A1 | 8/2012 | Tang et al. | |
| 2012/0256247 | A1 | 10/2012 | Alsmeier | |
| 2012/0261722 | A1 | 10/2012 | Tang et al. | |
| 2012/0273872 | A1* | 11/2012 | Lim | H01L 27/11582 257/329 |
| 2013/0009236 | A1 | 1/2013 | Lee et al. | |
| 2013/0052803 | A1 | 2/2013 | Roizin et al. | |
| 2014/0097486 | A1 | 4/2014 | Ramaswamy et al. | |

FOREIGN PATENT DOCUMENTS

| | | | |
|---|---|---|---|
| JP | 2012-146773 | | 8/2012 |
| KR | 10-0985882 | | 12/2009 |
| KR | 2009-0123481 | | 12/2009 |
| KR | 10-0979906 | | 4/2010 |
| KR | 10-2010-0088829 | A | 8/2010 |
| KR | 2011-0034816 | | 4/2011 |
| KR | 1020120028147 | A | 3/2012 |
| KR | 2012-0120537 | | 11/2012 |
| KR | 10-1241590 | | 3/2013 |
| WO | WO 2010-004047 | A1 | 1/2010 |

OTHER PUBLICATIONS

Office Action dated Jan. 20, 2020 from the Chinese Patent Office for corresponding Appl. No. CN 201710816314.2.

Office Action dated Nov. 29, 2019 from the Korean Patent Office for corresponding Korean Appl. No. 10-2014-0000838.

NOA for corresponding application No. KR 10-2014-0000838 dated May 29, 2020.

* cited by examiner

VERTICAL-TYPE NON-VOLATILE MEMORY DEVICES HAVING DUMMY CHANNEL HOLES

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCE TO RELATED APPLICATIONS

This application claims the benefit of Korean Patent Application No. 10-2014-0000838, filed on Jan. 3, 2014, in the Korean Intellectual Property Office, the disclosure of which is incorporated herein in its entirety by reference.

BACKGROUND

The inventive concepts relate to non-volatile memory devices, and more particularly, to vertical-type non-volatile memory devices in which channel structures extend in a vertical direction.

While the sizes of electronic products may be gradually reduced, there may be demand for the products to perform data processing at higher capacity. Accordingly, an integration degree of semiconductor memory devices used in the electronic products may be increased. One method of increasing the integration degree of semiconductor memory devices may involve non-volatile memory devices having a vertical structure, instead of a planar transistor structure.

SUMMARY

The inventive concepts provide a vertical-type nonvolatile memory device in which differences between the sizes of channel holes, which are defined in a process of forming a channel structure, are reduced. Thus, integration density and/or reliability may be improved.

According to some embodiments of the inventive concepts, a vertical-channel nonvolatile memory device includes a substrate having channel hole recess regions in a surface thereof. Channel structures vertically protrude from the surface of the substrate on ones of the channel hole recess regions, and memory cell stacks including insulating and conductive layers are alternately stacked along sidewalls of the channel structures. A common source line extends along the surface of the substrate on other ones of the channel hole recess regions in a word line recess region, which separates adjacent memory cell stacks.

In some embodiments, a distance between the ones of the channel hole recess regions having the channel structures thereon and the other ones of the channel hole recess regions immediately adjacent thereto may be greater than a distance between the ones of the channel hole recess regions immediately adjacent one another.

In some embodiments, non-functional channel contact structures including a channel material layer may be provided in the other ones of the channel hole recess regions.

In some embodiments, non-functional dummy channel structures may vertically protrude from the substrate surface on the other ones of the channel hole recess regions adjacent sidewalls of the common source line.

In some embodiments, levels of respective surfaces of the word line recess region and the other ones of the channel hole recess regions may be non-coplanar.

According to an aspect of the inventive concepts, there is provided a vertical-type nonvolatile memory device including: a substrate; a channel structure extending on the substrate in a first direction perpendicular to a main surface of the substrate; a plurality of memory cell stacks including a ground selection line, a plurality of word lines, and a string selection line, wherein the ground selection line, the plurality of word lines, and the string selection line are sequentially formed so as to be separate from each other on a side surface of the channel structure in the first direction; and a common source region formed on a first surface of the substrate between each of the plurality of memory cell stacks, wherein a recess region, which has a bottom corresponding to a second surface having a lower level than that of the first surface of the substrate, is formed in the substrate.

The vertical-type nonvolatile memory device may further include a first channel material layer filling the recess region.

A level of an upper surface of the first channel material layer may be higher than that of an upper surface of the substrate on which the common source region is formed.

The first channel material layer may be formed to contact a lower sidewall of the common source region.

The vertical-type nonvolatile memory device may further include a dummy channel structure that contacts a sidewall of the common source region and overlaps with a portion of an upper surface of the first channel material layer in the first direction.

A channel hole recess region, which is lower than a level of the bottom of the recess region, may be formed on the substrate.

A channel hole protruding portion, which is higher than a level of the bottom of the recess region and is lower than a level of an upper surface of the substrate, may be formed on the substrate.

According to another aspect of the inventive concepts, there is provided a vertical-type nonvolatile memory device including: a substrate; a channel structure extending on the substrate in a first direction perpendicular to a main surface of the substrate; a plurality of word lines sequentially formed so as to be separate apart from each other on a side surface of the channel structure in the first direction; a common source region formed between the plurality of word lines; and at least one dummy channel structure formed along a sidewall of the common source region, wherein the at least one dummy channel structure is disposed between the channel structure and the common source region.

The at least one dummy channel structure may include a plurality of dummy channel structures that are disposed in a line in a second direction perpendicular to the first direction.

The at least one dummy channel structure may include a channel layer and a charge storage layer, wherein a surface of the at least one dummy channel structure, which faces the common source region, is covered with a blocking insulating layer.

The at least one dummy channel structure may include a dummy hole of which the inside is empty or unobstructed.

A distance between the dummy channel structure and a channel structure formed on a word line formed in the shortest distance from the dummy channel structure may be larger than the shortest distance between channel structures formed on the word line.

The inside of the at least one dummy channel structure may be formed of an insulating material.

The common source region may be formed on a first surface of the substrate, and the at least one dummy channel structure may be formed on a second surface having a level that is different from that of the first surface of the substrate.

The vertical-type nonvolatile memory device may further include a plurality of word line contacts that are formed respectively on the plurality of word lines and are connected respectively to the plurality of word lines, wherein the dummy channel structure is disposed around the plurality of word line contacts.

BRIEF DESCRIPTION OF THE DRAWINGS

Exemplary embodiments of the inventive concepts will be snore clearly understood from the following detailed description taken in conjunction with the accompanying drawings in which.

DETAILED DESCRIPTION OF THE EMBODIMENTS

Figure 1:
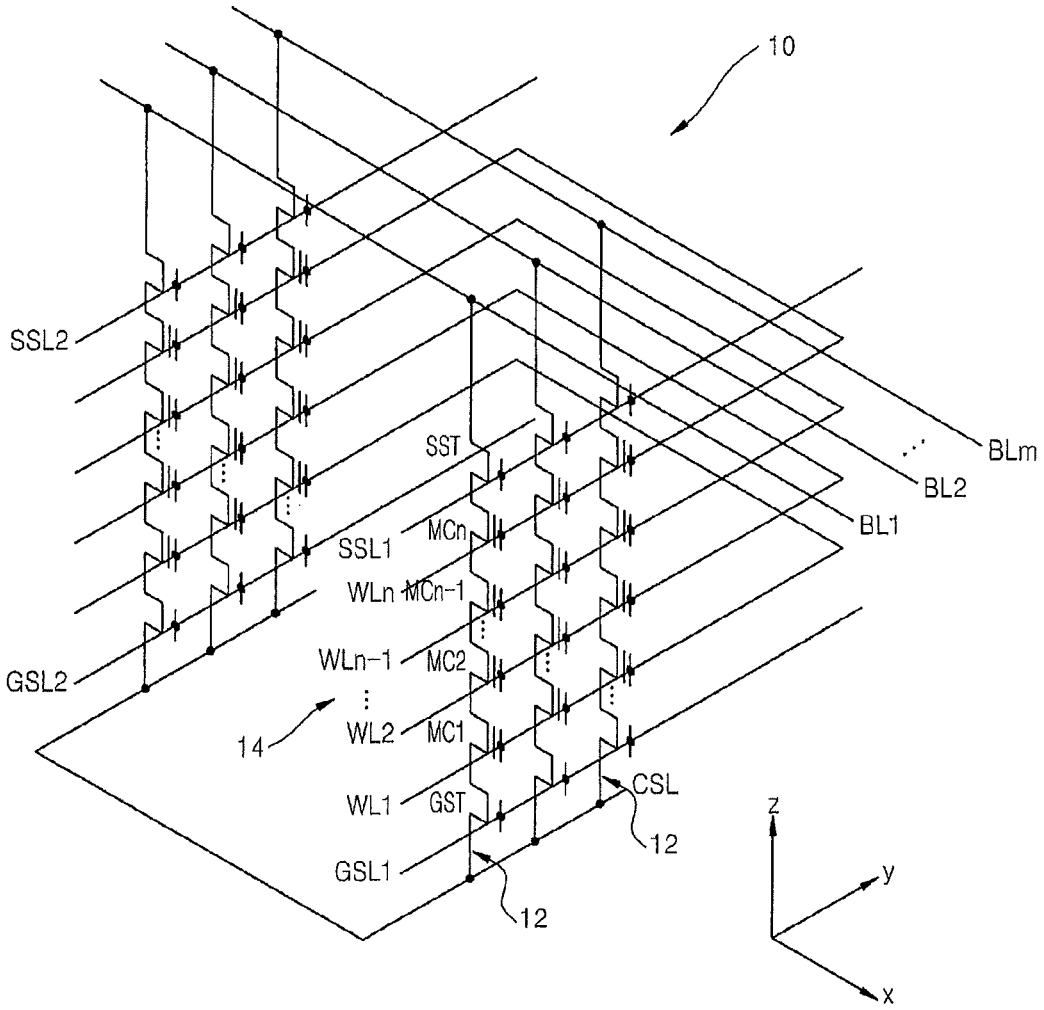
FIG. 1 is an equivalent circuit diagram of a memory cell array of a nonvolatile memory device according to some embodiments of the inventive concepts.

Hereinafter, exemplary embodiments of the inventive concepts will be described in detail with reference to the accompanying drawings. The inventive concepts will now be described more fully with reference to the accompanying drawings, in which exemplary embodiments of the inventive concepts are shown. The inventive concepts may, however, be embodied in many different forms and should not be construed as being limited to the embodiments set forth herein; rather, these embodiments are provided so that this disclosure will be thorough and complete, and will fully convey the inventive concepts to those of ordinary skill in the art. Like reference numerals refer to like elements throughout the specification.

The terminology used herein is for the purpose of describing particular embodiments only and is not intended to be limiting of the inventive concepts. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concepts.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concepts.

Unless otherwise defined, all terms (including technical and scientific terms) used herein have the same meaning as commonly understood by one of ordinary skill in the art to which the present inventive concepts belong. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

As used herein, the term "and/or" includes any and all combinations of one or more of the associated listed items. Expressions such as "at least one of," when preceding a list of elements, modify the entire list of elements and do not modify the individual elements of the list.

Non-volatile memory devices according to embodiments of the inventive concepts may include a cell array area, a peripheral circuit area, a sense amplifier area, a decoding circuit area, and a connection area. A plurality of memory cells, bit lines, and word lines, which are connected to the plurality of memory cells, are disposed in the cell array area. Circuits for driving the memory cells are disposed in the peripheral circuit area, and circuits for reading data stored in the memory cells are disposed in the sense amplifier area. The connection area may be disposed between the cell array area and the decoding circuit area, and an interconnection structure electrically connecting the word lines to the decoding circuit area may be disposed in the connection area.

FIG. 1 is an equivalent circuit diagram of a memory cell array 10 of a nonvolatile memory device according to some embodiments of the inventive concepts. In particular, FIG. 1 is an equivalent circuit diagram of a vertical-type NAND flash memory device having a vertical channel structure.

Referring to FIG. 1, the memory cell array 10 may include a plurality of memory cell strings 12. Each of the memory cell strings 12 may have a vertical structure that extends in a vertical direction (z direction) with respect to extension directions (x and y directions) that are parallel to a main surface of a substrate. A memory cell block 14 connected to a plurality of word lines WL1 to WLn may be constituted by a plurality of memory cell strings 12.

Each of the memory cell strings 12 may include a plurality of memory cells MC1 to MCn, a string selection transistor SST, and a ground selection transistor GST. In each of the memory cell strings 12, the ground selection transistor GST, the memory cells MC1 to MCn, and the string selection transistor SST may be disposed in series in the vertical direction (z direction). The memory cells MC1 to MCn may store data. The plurality of word lines WL1 to WLn may be respectively connected to the memory cells MC1 to MCn, and may respectively control the memory cells MC1 to MCn. The number of memory cells MC1 to MCn may be adjusted according to the capacity of a semiconductor memory device.

A plurality of bit lines BL1 to BLm extending in the x direction may be connected to one side of the memory cell strings 12 arranged at first to mth columns, for example, to a drain of the string selection transistor SST. Also, a common source line CSL may be connected to the other side of the memory cell strings 12, for example, to a source of the ground selection transistor GST.

A word line (for example, WL1) extending in the y direction may be connected in common to gate electrodes of memory cells arranged in the same layer (for example, the memory cells arranged in the same layer as MC1), among the memory cells MC1 to MCn of the memory cell strings 12. According to the driving of the word lines WL1 to WLn, data may be programmed/read or erased into/from the memory cells MC1 to MCn.

In each memory cell string 12, the string selection transistor SST may be disposed between the bit line (for example, BL1) and the uppermost memory cell MCn. Each string selection transistor SST in the memory cell block 14 may control data transmission between the bit lines BL1 to BLm and the memory cells MC1 to MCn by a string selection line SSL connected to a gate of the string selection transistor SST.

The ground selection transistor GST may be disposed between the lowermost memory cell MC1 and the common source line CSL. Each ground selection transistor GST in the memory cell block 14 may control data transmission between the common source line CSL and the memory cells MC1 to MCn by a ground selection line GSL connected to a gate of the ground selection transistor GST.

Figure 2:
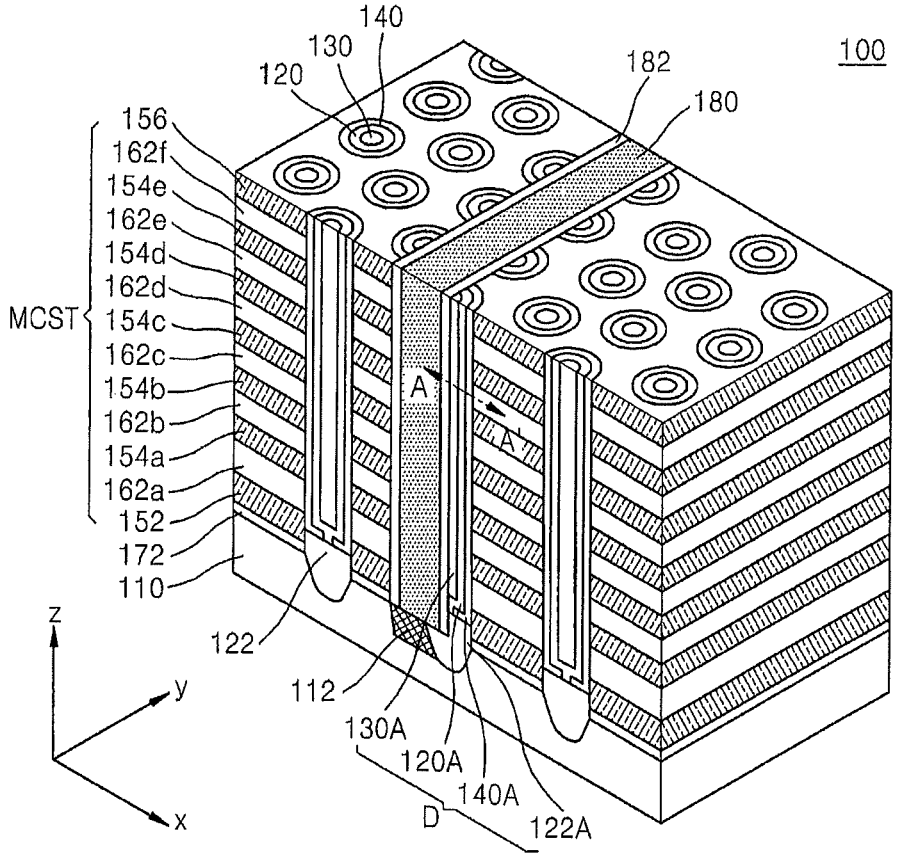
FIG. 2 is a schematic perspective view of a three-dimensional (3D) structure of memory cell strings of a nonvolatile memory device according to some embodiments of the inventive concepts.

FIG. 2 is a schematic perspective view of a three-dimensional (3D) structure of memory cell strings of a nonvolatile memory device 100 according to some embodiments of the inventive concepts. In FIG. 2, the illustration of some elements constituting or defining the memory cell string 12 of FIG. 1 are omitted. For example, the illustration of a bit line of the memory cell string 12 is omitted.

Referring to FIG. 2, the nonvolatile memory device 100 may include a channel region 120 disposed on a substrate 110 and a plurality of memory cell strings MCST disposed along a sidewall of the channel region 120. The plurality of memory cell strings MCST may be arranged along the y direction. As illustrated in FIG. 2, the plurality of memory cell strings MCST extending in the z direction from the substrate 110 may be arranged along a side surface of the channel region 120. The memory cell strings MCST correspond to the memory cell strings 12 of FIG. 1. Each memory cell string MCST may include a ground selection transistor GST (see FIG. 1), a plurality of memory cells MC1 to MCn (see FIG. 1), and a string selection transistor SST (see FIG, 1). In some cases, two ground selection transistors and two string selection transistors may be provided.

A main surface of the substrate 110 may extend in the x direction and the y direction. The substrate 110 may include a silicon (Si) substrate, a germanium (Ge) substrate, a silicon-germanium (SiGe) substrate, and/or a silicon-on-insulator (SOI) substrate. The substrate 110 may include a semiconductor material, for example, a Group IV semiconductor, a Group III-V compound semiconductor, or a Group II-VI oxide semiconductor. In the present embodiment, the Group IV semiconductor may include Si, Ge, or SiGe. The substrate 110 may be a bulk wafer or an epitaxial layer.

A source region 112 extending in the y direction that is parallel to the main surface of the substrate 110 is provided on the substrate 110. Although one source region 112 is illustrated in FIG. 1, a plurality of source regions 112 may be disposed so that they extend in the y direction and are separate from each other in the x direction that is perpendicular to the y direction.

The channel region 120 having a pillar shape may extend in the z direction that is perpendicular to the direction of the main surface of the substrate 110. A plurality of channel regions 120 may be disposed separate from each other along the x direction and the y direction, and may be disposed in a zig-zag shape along the x or y direction. That is, channel regions 120 that are adjacent or aligned to each other in the y direction may be disposed in an offset manner in the x direction. The channel region 120 may be formed in an annular shape. However, the present embodiment is not limited thereto, and the channel region 120 may be formed in a circular or square pillar shape, or the channel region 120 may be formed only at two opposing side surfaces and a bottom surface of a square pillar.

The channel region 120 may be electrically connected to the substrate 110 at a bottom surface thereof. For example, as illustrated in FIG. 2, the channel region 120 may include a channel contact 122 protruding from a bottom surface thereof and may be connected to the substrate 110 via the channel contact 122. In some cases, a majority or the entire bottom surface of the channel region 120 may be connected to the substrate 110.

The channel region 120 may include a semiconductor material such as polysilicon or noncrystalline silicon, and the semiconductor material may not be doped or may include a p-type or n-type dopant. A buried insulating layer 130 having a circular pillar structure may be formed in the channel region 120. In example embodiments of the inventive concepts, the buried insulating layer 130 may be formed of an insulating material such as silicon oxide and/or silicon nitride, and/or may be formed as an air gap.

Although not illustrated in FIG. 2, a conductive layer 190 (see FIG. 5) may be formed on the channel region 120 and the buried insulating layer 130, and thus may be electrically connected to the channel region 120. The conductive layer 190 may function as a drain region of a string selection transistor SST (see 191 of FIG. 5).

The string selection transistors SST may be arranged in the x or y directions and may be connected to the bit lines BL1 to BLm (see FIG. 1) through the conductive layer 190. The bit lines BL1 to BLm may be formed of line-shaped patterns extending in or along the x direction and may be electrically connected to the conductive layer 190. Each of the ground selection transistors GST (see FIG. 1) arranged in the x direction may be electrically connected to the source region 112 adjacent thereto.

A gate dielectric layer 140 may be formed on the sidewall of the channel region 120. The gate dielectric layer 140 may extend in the z direction, which is perpendicular to the substrate 110, along the sidewall of the channel 120. A bottom surface of the gate dielectric layer 140 may contact the channel contact 122. In the present embodiment, the gate dielectric layer 140 may have a structure in which a tunnel insulating layer 142, a charge storage layer 144, and a blocking insulating layer 146 (see FIG. 5) are sequentially stacked.

A ground selection line 152, a plurality of word lines 154a to 154e, and a string selection line 156 may be formed on the sidewall of the channel region 120 and may be spaced apart from each other in the z direction perpendicular to the main surface of the substrate 110. The ground selection line 152, the plurality of word lines 154a to 154e, and the string selection line 156 each may be disposed to surround sidewalls of a plurality of channel regions 120 arranged in rows and columns and to extend in the x direction parallel to the main surface of the substrate 110. A lower insulating layer 172 may be formed between the ground selection line 152 and the substrate 110. Although not illustrated in FIG. 2, an upper insulating layer 174 (see FIG. 5) may be formed on an upper surface of the string selection line 156.

The gate dielectric layer 140 may be interposed between the channel region 120 and the ground selection line 152, between the channel region 120 and the plurality of word lines 154a to 154e, and between the channel region 120 and the string selection line 156. The string selection line 156 and the channel region 120 and the gate dielectric layer 140 adjacent to the string selection line 156 may form or define the string selection transistor SST (see FIG. 1). The plurality of word lines 154a to 154e and the channel region 120 and the gate dielectric layer 140 adjacent to the plurality of word lines 154a to 154e may form or define the memory cell transistors MC1 to MCn (see FIG. 1). The ground selection line 152 and the channel region 120 and the gate dielectric layer 140 adjacent to the ground selection line 152 may form or define the ground selection transistor GST (see FIG. 1).

Thicknesses of the ground selection line 152, the word lines 154a to 154e, and the string selection line 156 may be equal to one another or be different from one another according to desired characteristics of the memory cell array 10 (see FIG. 1). Similarly, intervals between the ground selection line 152, the word lines 154a to 154e, and the string selection line 156 may be equal to one another or be different from one another according to desired characteristics of the memory cell array 10 (see FIG. 1). Although, in FIG. 2, an interval between the ground selection line 152 and the word line 154a that is closest to the substrate 110 is illustrated as being larger than an interval between the other word lines 154b to 154e by way of example, the inventive concepts are not limited thereto. In the present embodiment, the interval between the ground selection line 152 and the word line 154a that is closest to the substrate 110 may be formed to be relatively large to reduce or prevent interference between the ground selection line 152 and the plurality of word lines 154a to 154e, and the thickness of the ground selection line 152 and/or the thickness of the string selection line 156 may be varied to adjust a threshold voltage of the ground selection transistor GST and a threshold voltage of the string selection transistor SST.

In the present embodiment, the ground selection line 152, the plurality of word lines 154a to 154e, and the string selection line 156 each may include a metal silicide material. For example, the ground selection line 152, the plurality of word lines 154a to 154e, and the string selection line 156 each may include titanium silicide ($TiSi_x$), tantalum silicide ($TaSi_x$), tungsten silicide ($WSi_x$), cobalt silicide ($CoSi_x$), and/or nickel silicide ($NiSi_x$).

Interlayer insulating layers 162a to 162f may be interposed between the ground selection line 152 and the word line 154a that is closest to the substrate 110, between adjacent ones of the word lines 154a to 154e, and between the word line 154a that is furthest from the substrate 110 and the string selection line 156, respectively. The interlayer insulating layers 162a to 162f may be formed of silicon oxide, silicon oxynitride, and/or silicon nitride. The interlayer insulating layers 162a to 162f may electrically insulate the ground selection line 152, the plurality of word lines 154a to 154e, and the string selection line 156 from each other. The ground selection line 152, the plurality of word lines 154a to 154e, the string selection line 156, and the interlayer insulating layers 162a to 162f form or define the memory cell string MCST.

A common source line 180 may be formed on the source region 112 so as to extend in the z direction that is perpendicular to the main surface of the substrate 110. In the present embodiment, the common source line 180 may be formed of metal, such as tungsten (W), aluminum (Al), copper (Cu), titanium (Ti), tantalum (Ta), and/or the like, polysilicon doped with impurities, and/or other conductive materials, such as nickel silicide ($NiSi_x$), titanium silicide ($TiSi_x$), tungsten silicide ($WSi_x$), cobalt silicide ($CoSi_x$), and/or the like. A common source line spacer 182 may be formed on both sidewalls of the common source line 180 and may be formed of an insulating material. The common source line spacer 182 may electrically insulate the common source line 180 from the ground selection line 152, the plurality of word lines 154a to 154e, and the string selection line 156.

A dummy channel structure D may be formed adjacent to an outer part or periphery of the common source line 180. A cross-section of the dummy channel structure D, which is formed in a direction parallel to the direction of the main surface of the substrate 110, may not have a completely circular form, but rather, may have a semicircular form while contacting the common source line 180. The common source line spacer 182 may be interposed between the dummy channel structure D and the common source line 180. The dummy channel structure D may include a dummy channel region 120A, a channel material layer 122A, a dummy buried insulating layer 130A, and a dummy gate dielectric layer 140A. The dummy channel region 120A, the dummy buried insulating layer 130A, and the dummy gate dielectric layer 140A are formed on the word lines 154a to 154e, and are different from the channel region 120, the buried insulating layer 130, and the gate dielectric layer 140, which are formed so as not to be adjacent to the common source line 180, and may not perform their respective functions. In further embodiments, the dummy channel structure D may include a dummy hole of which the inside defines a cavity, unobstructed space, or is otherwise empty.

The channel material layer 122A may be formed to contact a lower sidewall of the common source line 180. The common source line spacer 182 may be interposed between the channel material layer 122A and the common source line 180. The channel material layer 122A may be disposed in a region in which the common source line 180 is formed on the substrate 110, and the bottom surface of the channel material layer 122A may be formed in a recess region that is lower than the upper surface of the substrate 110. The channel material layer 122A may be a dummy channel contact of the dummy channel structure D. The dummy channel contact, i.e., the channel material layer 122A, may not function as a contact, unlike the channel contact 122. The channel material layer 122A will be described in detail with reference to FIG. 5 later.

In the nonvolatile memory device 100 according to some embodiments of the inventive concepts, the sizes or dimensions of channel holes may be uniformly formed in a channel hole patterning and etching process forming a channel structure by forming the dummy channel structure D so as to be adjacent to the common source line 180 formed in the z direction that is perpendicular to the main surface of the substrate 110. That is, in performing a patterning and etching process for forming channel holes, a problem whereby the sizes of the channel holes may become different from each other due to an etch loading effect (which may occur when a word line recess region is blocked by an etch mask), may be solved by forming dummy channel holes in the word line recess region, which separates word lines from each other, as well as a word line region. In subsequent processes, the common source line 180 and the common source line spacer 182 may be formed in the word line recess region, and the dummy channel structure D may be formed in the dummy channel holes.

Although five word lines 154a to 154e are arranged in the example of FIG. 2, the inventive concepts are not limited thereto. That is, six or more word lines (i.e., memory cells) or four or less word lines may be arranged, depending on the capacity of the nonvolatile memory device 100. In addition, although one string selection transistor SST (see FIG. 1) and one wound selection transistor GST (see FIG. 1) are arranged in the memory cell string MCST in the present example, the inventive concepts are not limited thereto. For example, at least two string selection transistors SST and at least two ground selection transistors GST may be arranged in the memory cell string MCST so as to fill a space between the interlayer insulating layers 162a to 164f without a void. The string selection transistor SST and the ground selection transistor GST may have a structure that is different from that of the word lines 154a to 154e in some embodiments.

Figure 3A:
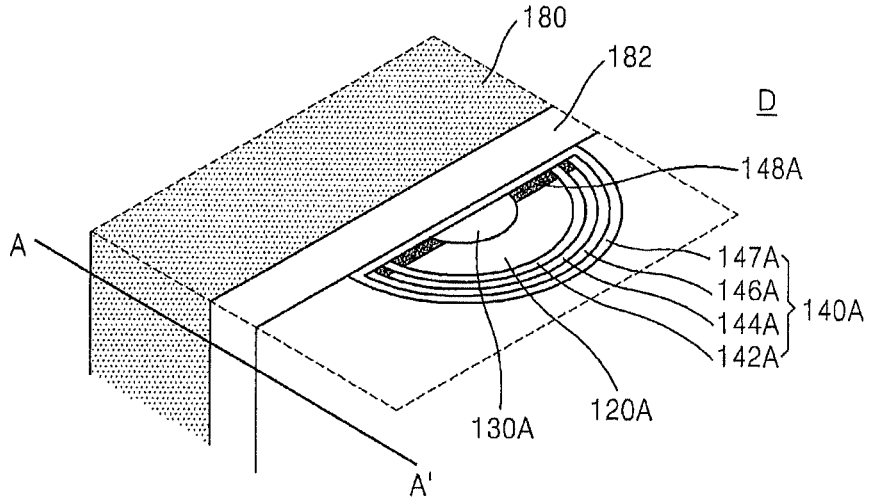
FIG. 3A is a perspective view of a cross-section area taken along line A-A' illustrated in FIG. 2, according to some embodiments of the inventive concepts.
Figure 3B:
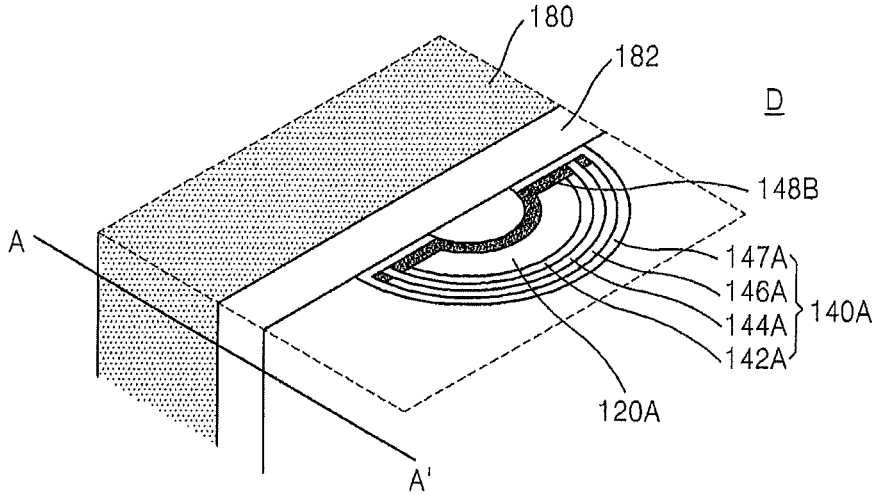
FIG. 3B is a perspective view of a cross-section area taken along line A-A' illustrated in FIG. 2, according to further embodiments of the inventive concepts.

FIG. 3A is a perspective view of a cross-section area taken along line A-A' illustrated in FIG. 2, according to some embodiments of the inventive concepts. FIG. 3B is a perspective view of a cross-section area taken along line A-A' illustrated in FIG. 2, according to further embodiments of the inventive concepts.

Referring to FIG. 3A, a dummy channel structure D may include a dummy channel region 120A, a dummy buried insulating layer 130A, and a dummy gate dielectric layer 140A. A semicircular dummy buried insulating layer 130A is formed at a side that is closest to the common source line 180, a fan-shaped dummy channel region 120A is formed to cover a sidewall of the semicircular dummy buried insulating layer 130A, and a fan-shaped dummy gate dielectric layer 140A is formed to cover a sidewall of the fan-shaped dummy channel region 120A. The fan-shaped dummy gate dielectric layer 140A may include a dummy tunnel insulating layer 142A, a dummy charge storage layer 144A, and a first dummy blocking insulating layer 146A, and a second dummy blocking insulating layer 147A, which are sequentially positioned from the fan-shaped dummy channel region 120A. The second dummy blocking insulating layer 147A may be formed to contact a portion of the side of the dummy buried insulating layer 130A, a portion of the dummy channel region 120A, and a portion of the dummy gate dielectric layer 140A.

The dummy tunneling insulating layer 142A may be a single layer or a composite layer including one or more of silicon oxide ($SiO_2$), silicon nitride ($Si_3N_4$), silicon oxynitride (SiON), a hafnium oxide ($HfO_2$), hafnium silicon oxide ($HfSi_xO_y$), aluminum oxide ($Al_2O_3$), and zirconium oxide ($ZrO_2$). The dummy charge storage layer 144A may be formed by depositing polysilicon by using chemical vapor deposition (CVD), for example, low pressure CVD using silane gas ($SiH_4$) or phosphine gas ($PH_3$). In further embodiments, the dummy charge storage layer 144A may include quantum dots or nanocrystals. The quantum dots or nanocrystals may be formed of fine particles of a conductor (e.g., metal) or semiconductor. The first and second dummy blocking insulating layers 146A and 147A may include one or more of silicon oxide ($SiO_2$), silicon nitride ($Si_3N_4$), silicon oxynitride (SiON), and a high dielectric constant (high-k) layer. The first and second dummy blocking insulating layers 146A and 147A may be formed of a material having a higher dielectric constant (high-k) than the dummy tunneling insulating layer 142A.

An oxide layer 148A may be formed at a part in which the dummy channel region 120A and the dummy charge storage layer 144A contact the second dummy blocking insulating layer 147A. The oxide layer 148A is formed to reduce or prevent the dummy channel region 120A and the dummy charge storage layer 144A from being silicified in a process of silicifying the word lines.

As illustrated in FIG. 3B, in a structure in which the dummy buried insulating layer 130A is omitted, an oxide layer 148B may be formed at a side that is exposed towards a common source line 180 of the fan-shaped dummy channel region 120A. The second dummy blocking insulating layer 147A may be formed to contact the oxide layer 148B and to cover the first dummy blocking insulating layer 146A.

A sidewall outer part of the dummy channel structure D adjacent to the common source line 180 may have a curved shape due to the second dummy blocking insulating layer 147A and the oxide layer 148A or 148B. In addition, the second dummy blocking insulating layer 147A and the oxide layer 148A or 148B may reduce or prevent the dummy channel structure D from being silicified in a process of forming the word lines 154a to 154e (see FIG. 2).

Figure 4:
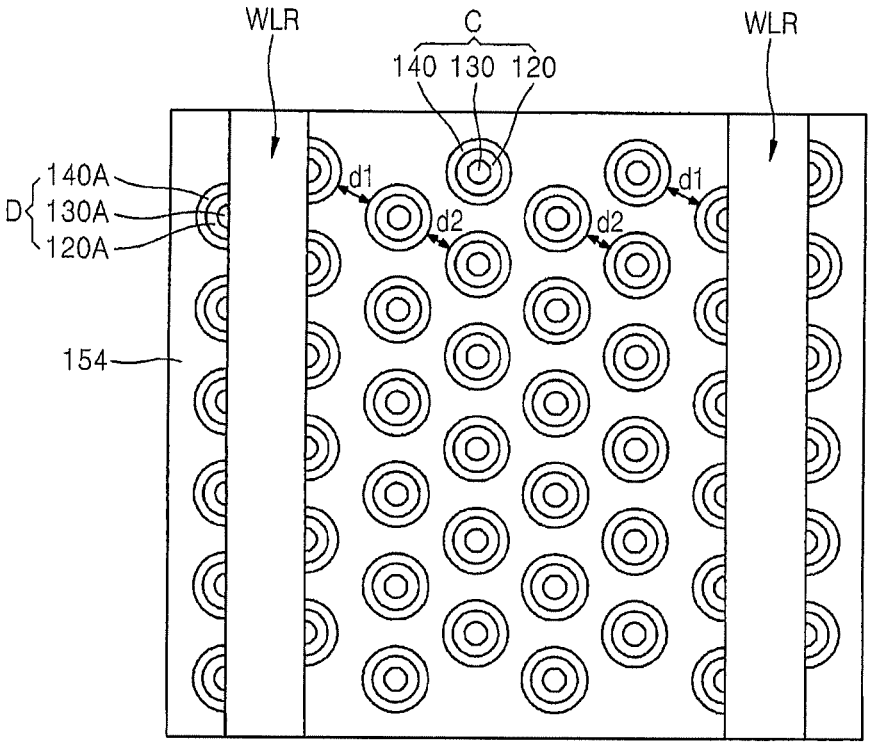
FIG. 4 is a plan view of a word line region of a nonvolatile memory device, according to some embodiments of the inventive concepts.

FIG. 4 is a plan view showing an arrangement of a channel structure in a word line region of the nonvolatile memory device 100, according to some embodiments of the inventive concepts.

Referring to FIG. 4, a channel structure C is formed on a word line 154 of a memory cell string MCST (see FIG. 2), and a dummy channel structure D is formed adjacent to a word line recess region WLR separating word lines 154 from each other, where the channel structure C includes a channel region 120, a buried insulating layer 130, and a gate dielectric layer 140. The shortest distance d1 between the dummy channel structure D formed adjacent to the word line recess region WLR and the closest channel structure C formed on the word line 154 of the memory cell string MCST may be larger than the shortest distance d2 between closest or immediately adjacent channel structures C formed on the word line 154 of the memory cell string MCST. Referring to FIGS. 2 and 3, the dummy channel structure D is formed adjacent to the common source line 180, and the common source line 180 is formed on the word line recess region WLR separating the word lines 154 from each other. In a patterning and etching process for forming channel holes to form the dummy channel structure D, differences between the sizes or dimensions of channel holes, which are caused due to an etch loading effect, may be reduced by making a distance between a dummy channel hole (or corresponding channel hole recess region), which is formed in the word line recess region WLR, and a closest channel hole (or corresponding channel hole recess region), which is formed in the word line 154 of a memory cell (that is, outside of the word line recess region WLR), larger than a distance between immediately adjacent channel holes/recess regions thereof, which are formed in the word line 154 of a memory cell and outside of the word line recess regions WLR.

Figure 5:
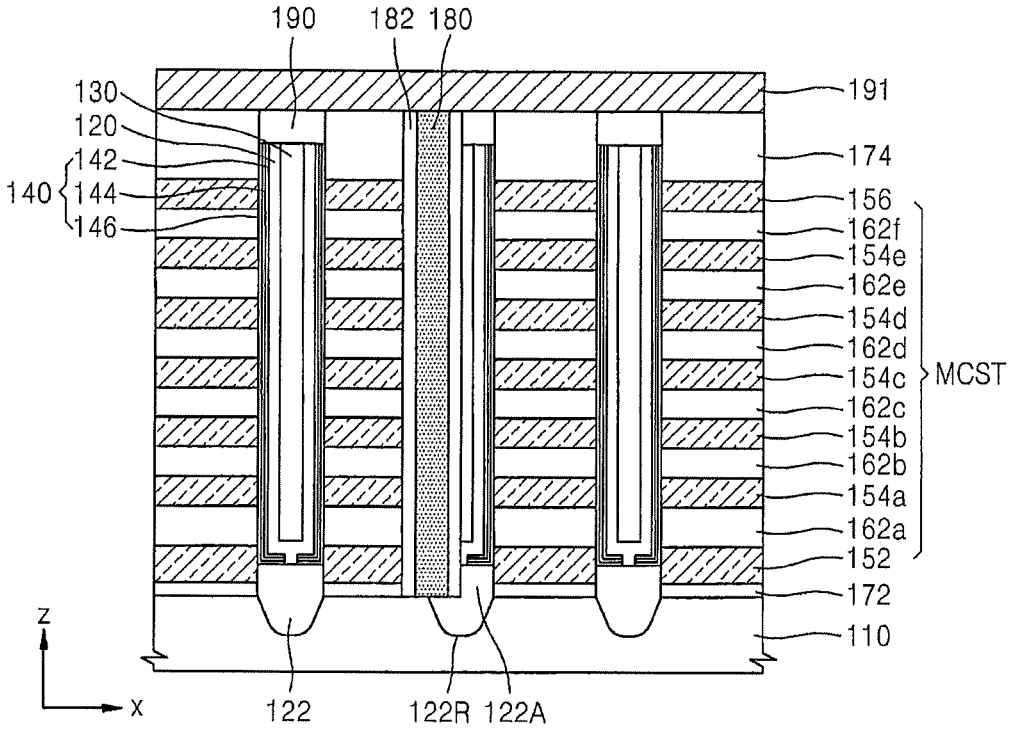
FIG. 5 is a cross-sectional view of a main part of a nonvolatile memory device, according to some embodiments of the inventive concepts.

FIG. 5 is a cross-sectional view of a main part of the nonvolatile memory device 100 of FIG. 2.

Referring to FIG. 5, the channel contact 122 and the channel material layer 122A are positioned in a region recessed in a direction that is perpendicular to the main surface of the substrate 110, and the channel material layer 122A adjacent to the common source line 180 is formed on or to cover the sidewall and bottom surface of an outer part of the common source line 180. The channel material layer 122A may be formed between the common source line 180 and the memory cell string MCST. The common source line 180 is formed in the direction that is perpendicular to the main surface of the substrate 110, and the memory cell string MCST includes the ground selection line 152, the plurality of word lines 154a to 154e, the string selection line 156, and the interlayer insulating layers 162a to 162f that are interposed between the ground selection line 152, the plurality of word lines 154a to 154e, and the string selection line 156. In addition, the channel material layer 122A may be formed in a space recessed or dug inward as a channel contact recess region 122R of the substrate 110. That is, this is because when forming a word line recess region WLR (see FIG. 4) to form the common source line 180, the channel material layer 122A, which corresponds to a channel contact of the dummy channel structure D formed in the channel contact recess region 122R in the substrate 110, was not completely removed while a patterning and etching process for forming a dummy channel hole is performed. In the present embodiment, the channel material layer 122A may be a dummy channel contact. The channel material layer 122A may be formed of a conductor including a doped polysilicon. The channel material layer 122A may be a silicon epitaxial layer.

Figure 6:
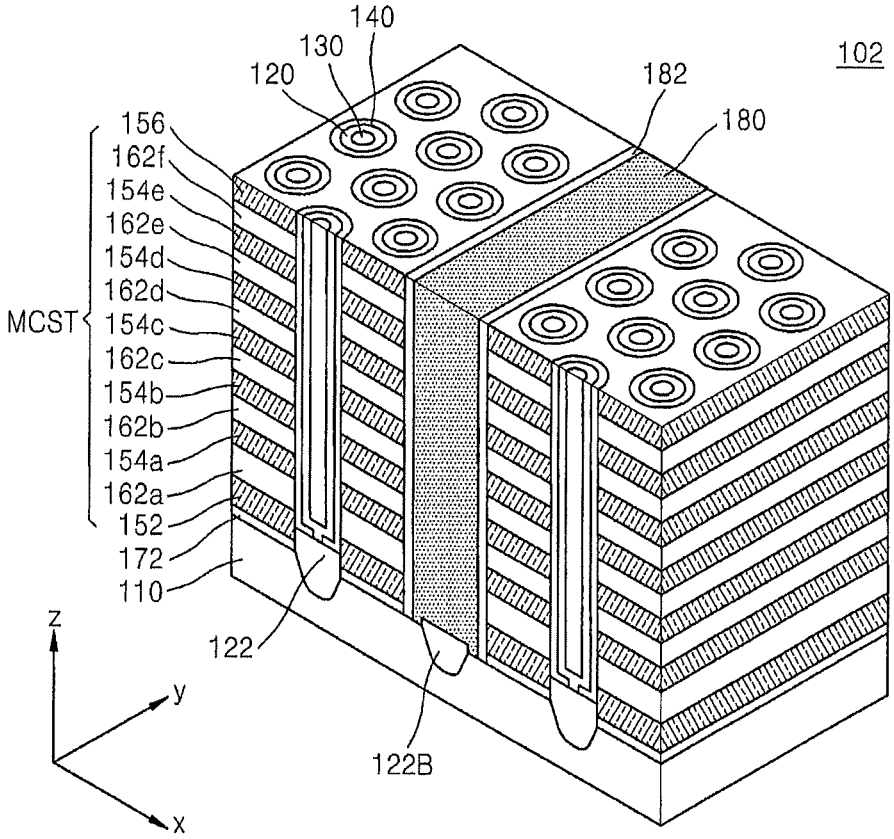
FIG. 6 is a schematic perspective view of a 3D structure of memory cell strings of a nonvolatile memory device according to further embodiments of the inventive concepts.

FIG. 6 is a schematic perspective view of a 3D structure of memory cell strings of a nonvolatile memory device 102 according to further embodiments of the inventive concepts.

The nonvolatile memory device 102 illustrated in FIG. 6 has elements that are the same as those of the nonvolatile memory device 100 illustrated in FIG. 2. However, in the nonvolatile memory device 102 illustrated in FIG. 6, a dummy channel structure like the dummy channel structure D of FIG. 2 is not formed at a sidewall of a common source line 180, and a channel material layer 122B may remain only in a substrate 110 on which the common source line 180 was is formed. Repeated descriptions of the elements that are the same as those of FIG. 2 are omitted below.

The level of an upper surface of the channel material layer 122B may be higher than that of an upper surface of the substrate 110. In the present embodiment, the channel material layer 122B may be a dummy channel contact. A lower surface of the channel material layer 122B is formed in a recessed region in the substrate 110, and a detailed description of the channel material layer 122B will be provided with reference to FIG. 8A later.

Figure 7A:
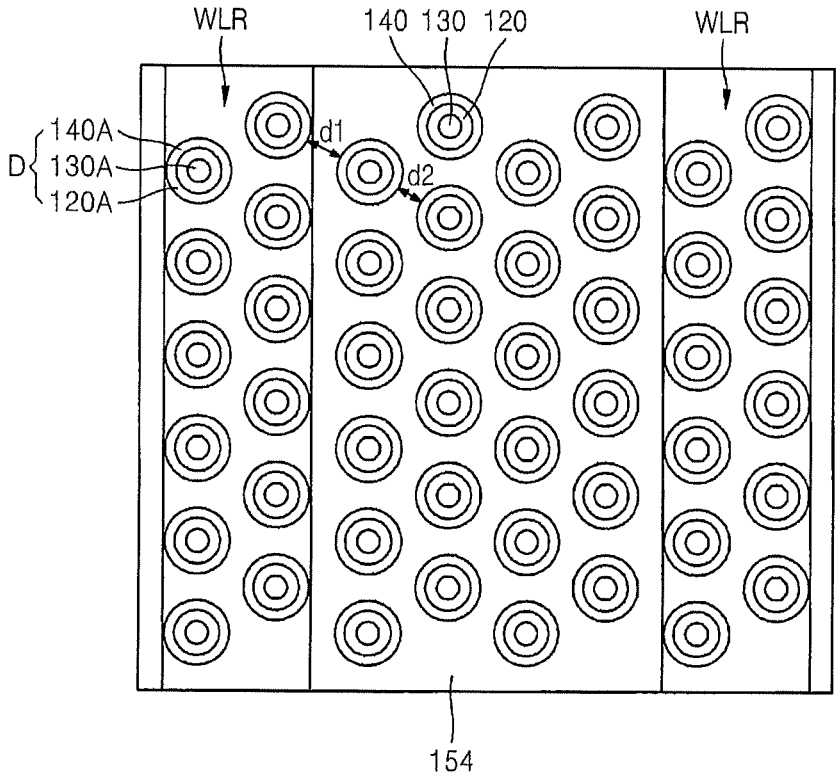
FIGS. 7A and 7B each are a plan view of a word line region of a nonvolatile memory device, according to embodiments of the inventive concepts.
Figure 7B:
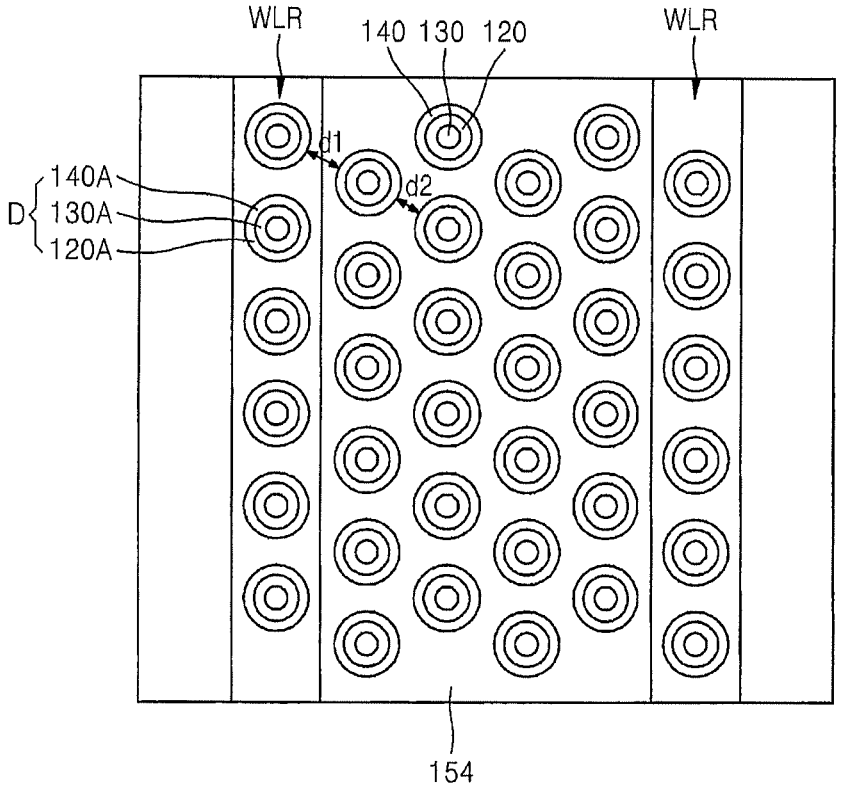

FIGS. 7A and 7B each are a plan view of a part of the nonvolatile memory device 102 illustrated in FIG. 6.

Referring to FIGS. 7A and 7B, a dummy channel structure D may be included in a word line recess region WLR and may be etched and removed in a subsequent process. The dummy channel structure D may be included in the word line recess region WLR on the word line 154. The dummy channel structure D may include a dummy channel region 120A, a dummy buried insulating layer 130A, and a dummy gate dielectric layer 140A. The dummy channel structures D may be formed in two or more columns, as shown in FIG. 7A, or may be formed only in one single column as shown in FIG. 7B. However, the inventive concepts are not limited thereto. That is, the dummy channel structures D may be formed in three columns or four or more columns. The dummy channel structures D may be etched and removed in a process of forming the word line recess region WLR.

Figure 8A:
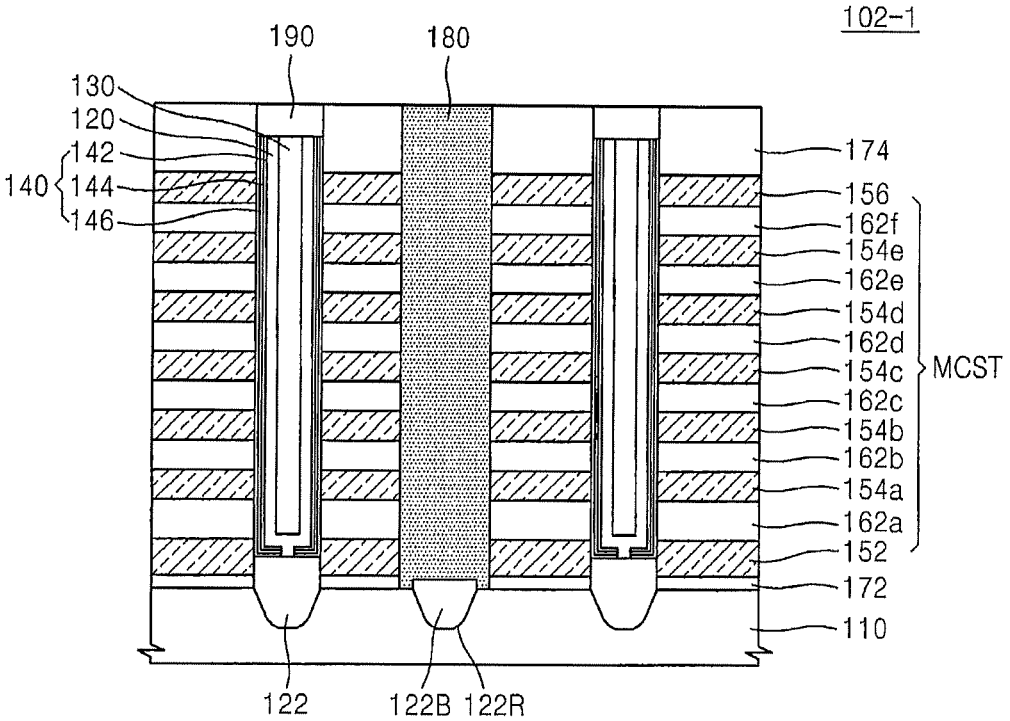
FIGS. 8A to 8C each are a cross-sectional view of a main part of the nonvolatile memory device illustrated in FIG. 6, according to embodiments of the inventive concepts.
Figure 8B:
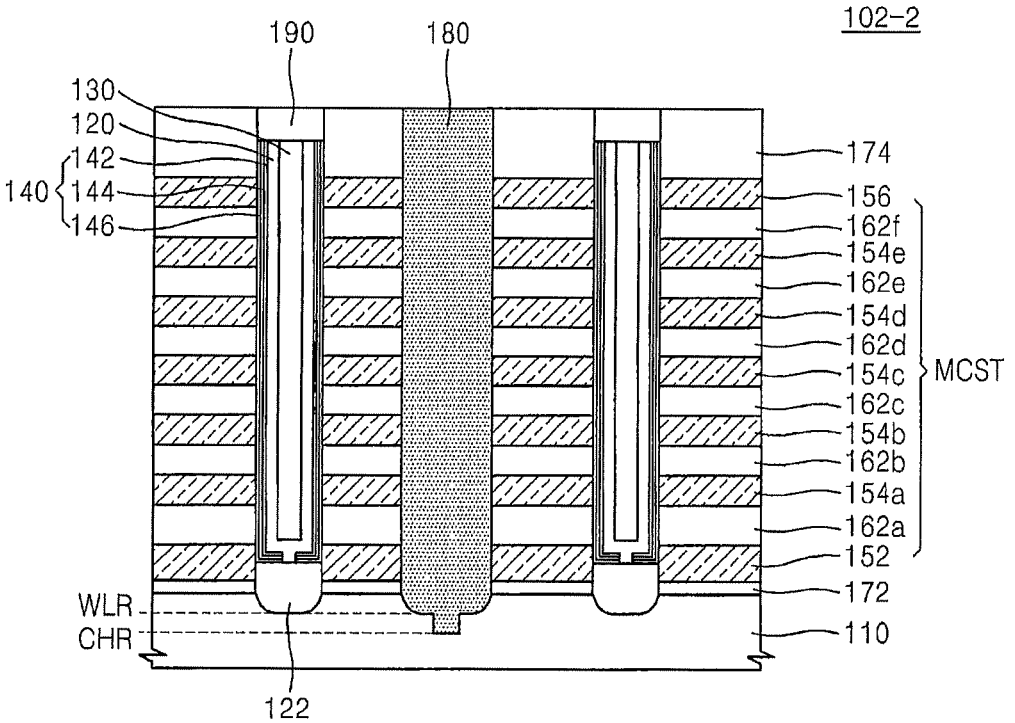
Figure 8C:
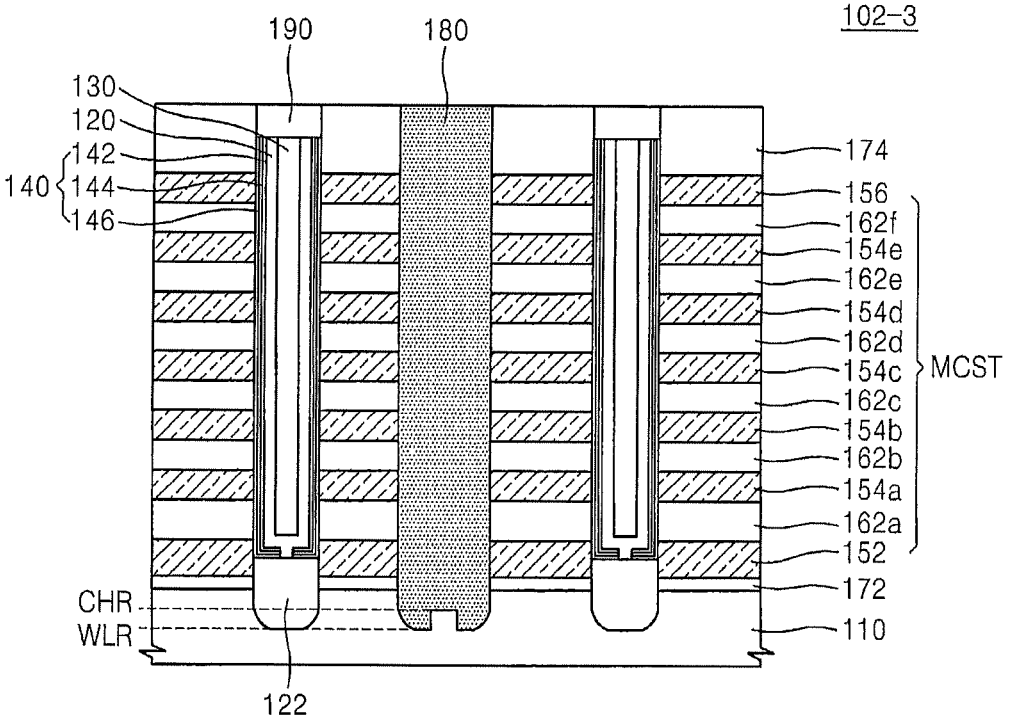

FIGS. 8A to 8C are cross-sectional view of main parts of nonvolatile memory devices 102-1, 102-2, and 102-3 according to other embodiments of the inventive concepts.

Referring to FIG. 8A, in the nonvolatile memory device 102-1, a portion of a channel material layer 122B may remain in a recessed space of a substrate 110, in which a word line recess region was formed. Unlike the embodiment of FIG. 5, in the nonvolatile memory device 102-1, the channel material layer 122B may exist only in a channel contact recess region 122R of the substrate 110, in which the word line recess region WLR was formed. The channel material layer 122B is formed so as not to contact a sidewall of a common source line 180. That is, the channel material layer 122B or a dummy channel structure is not formed between memory cell strings MCST, that is, in the outer part of the word line recess region WLR. Each of the memory cell strings MCST includes a ground selection line 152, a plurality of word lines 154a to 154e, a string selection line 156, and interlayer insulating layers 162a to 162f that are interposed between the ground selection line 152, the plurality of word lines 154a to 154e, and the string selection line 156. The reason why the dummy channel structure is not formed is because the dummy channel structure is etched and removed while forming the word line recess region WLR in a position where the dummy channel structure was formed, as described with reference with FIGS. 7A and 7B. However, a portion of the channel material layer 122B included in the dummy channel structure may remain due to an etching process. In the present embodiment, the channel material layer 122B may be a dummy channel contact. Repeated descriptions of the elements that are the same as those of FIG. 5 are omitted below.

In the nonvolatile memory devices 102-2 and 102-3 illustrated in FIGS. 8B and 8C, the channel material layer 122B does not remain on an upper surface of the substrate 110 in which the word line recess region WLR was formed, unlike the nonvolatile memory device 102-1 illustrated in FIG. 8A. A bend or flextion recessed in a direction, which is perpendicular to the substrate 110, or a protruding portion may be formed in the upper surface of the substrate 110 on which the word line recess region WLR was formed. That is, in the nonvolatile memory device 102-2 illustrated in FIG. 8B, the level of an upper surface of the substrate 110 in which the word line recess region WLR was formed may be higher than that of an upper surface of the substrate 110 in which a channel hole recess region CHR was formed. In the nonvolatile memory device 102-3 illustrated in FIG. 8C, the level of an upper surface of the substrate 110 in which the word line recess region WLR was formed may be lower than that of an upper surface of the substrate 110 in which a channel hole recess region CHR was formed. That is, the level of the upper surface of the word line recess region WLR in the substrate 110 may be different from or non-coplanar with that of the upper surface of the channel hole recess region CHR in the substrate 110. This is because the word line recess region WLR is formed after first forming the channel hole recess region CHR and, in this case, a degree of etching when forming the channel hole recess region CHR is different from a degree of etching when forming the word line recess region WLR.

Figure 9:
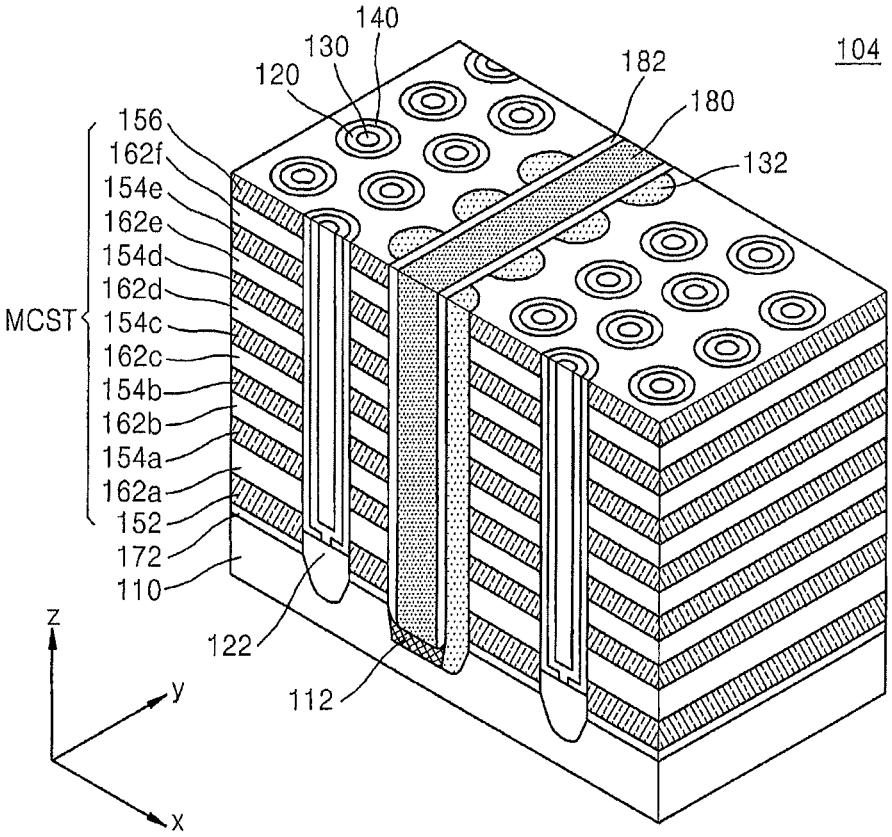
FIG. 9 is a schematic perspective view of a 3D structure of memory cell strings of a nonvolatile memory device according to further embodiments of the inventive concepts.

FIG. 9 is a schematic perspective view of a 3D structure of memory cell strings of a nonvolatile memory device 104 according to some embodiments of the inventive concepts.

The nonvolatile memory device 104 illustrated in FIG. 9 has elements that are the same as those of the nonvolatile memory device 100 illustrated in FIG. 2. However, unlike the nonvolatile memory device 100, the nonvolatile memory device 104 may include an insulating pattern structure 132 in which the inside of a dummy channel structure formed adjacent to a common source line 180 is formed of an insulating material. Descriptions of the elements that are the same as those of the nonvolatile memory device 100 illustrated in FIG. 2 are omitted.

The insulating pattern structure 132 is formed adjacent to the common source line 180, has a semi-circular cross-section, and extends in the z direction perpendicular to a direction of a main surface of the substrate 110. The insulating pattern structure 132 may include an insulating material such as silicon oxide ($SiO_2$), silicon nitride (SiN or $Si_3N_4$), silicon oxynitride (SiON), and/or a high dielectric constant (high-k) layer. Since the insulating pattern structure 132 is formed of the above-stated insulating materials, a portion of the dummy channel structure may be prevented from being silicified in a process of silicifying a ground selection line 152, a plurality of word lines 154a to 154e, and a string selection line 156 through a word line recess region WLR (see FIG. 4).

FIGS. 10 to 16 are cross-sectional views illustrating a method of manufacturing the nonvolatile memory device 104 illustrated in FIG. 9, according to some embodiments of the inventive concepts.

Figure 10:
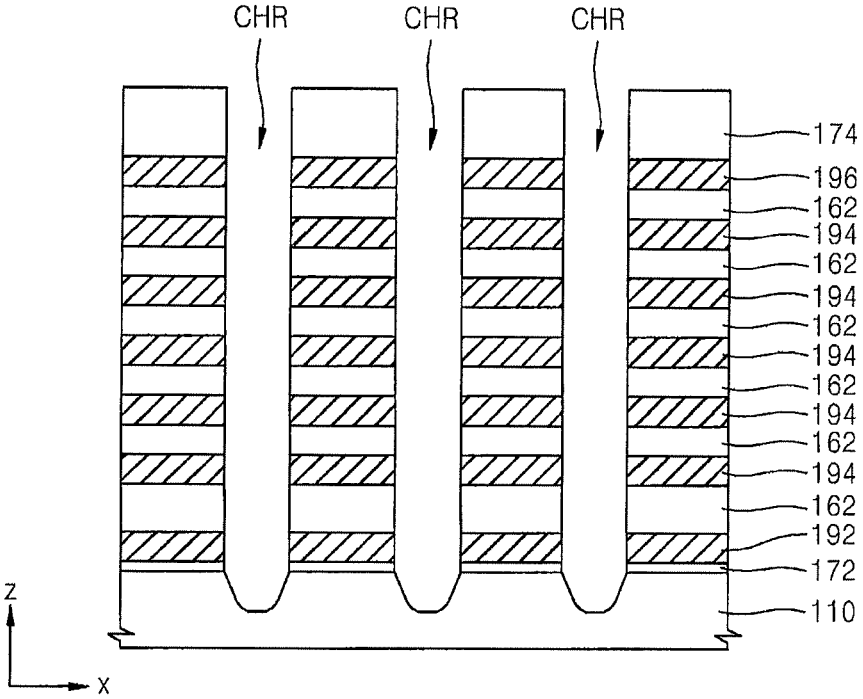
FIGS. 10 to 16 are cross-sectional views illustrating a method of manufacturing a nonvolatile memory device, according to some embodiments of the inventive concepts.

Referring to FIG. 10, a lower insulating layer 172 is formed on a substrate 110, and a first sacrificial layer 192 is formed on the lower insulating layer 172. A plurality of interlayer insulating layers 162 and a plurality of second sacrificial layers 194 are alternately formed on the first sacrificial layer 192. One of the interlayer insulating layers 162 and a third sacrificial layer 196 are sequentially formed on the uppermost second sacrificial layer 194.

In the present embodiment, the lower insulating layer 172 may be formed by using an insulating material such as silicon oxide ($SiO_2$), silicon nitride (SiN or $Si_3N_4$), and/or silicon oxynitride (SiON). The first to third sacrificial layers 192, 194, and 196 may be formed by using a conductive material such as polysilicon doped with impurities.

The number of second sacrificial layers 194 and/or the number of third sacrificial layers 196 may vary according to the number of word lines 154a to 154e of FIG. 9 and the number of string selection lines 156 of FIG. 9, where the word lines 154a to 154e and the string selection lines 156 are formed in subsequent processes. Although only one first sacrificial layer 192 is illustrated in FIG. 10, two or more sacrificial layer 192 may be stacked when two or more ground selection lines 152 (see FIG. 9) are formed. The thicknesses of and/or intervals between the first to third sacrificial layers 192, 194, and 196 may also be different from each other. In exemplary embodiments, a vertical direction interval between the ground selection line 152 and the word line 154a may be adjusted by increasing the thickness of the lower insulating layer 172 stacked between the first sacrificial layer 192 and the lowest second sacrificial layer 194.

The lower insulating layer 172, the first to third sacrificial layers 192, 194, and 196, the interlayer insulating layer 162, and an upper insulating layer 174 may be anisotropically etched to form channel hole recess regions CHR that penetrate and extend through the first to third sacrificial layers 192, 194, and 196 and the interlayer insulating layer 162. The channel hole recess regions CHR may further extend through the lower insulating layer 172 and at least partially into the substrate 110.

Figure 11:
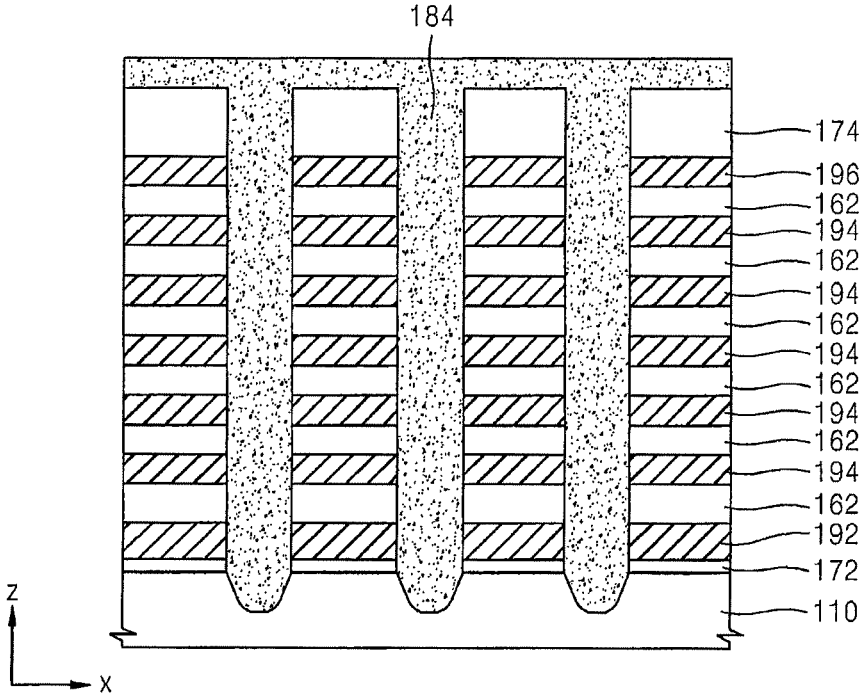

Referring to FIG. 11, a first sacrificial material layer 184, which fills the channel hole recess region CHR and extends onto or covers an upper surface of the upper insulating layer 174, is formed. The first sacrificial material layer 184 may be formed of silicon on glass (SOG), silicon organic hybrid (SOH), and/or silicon-germanium (SiGe).

Figure 12:
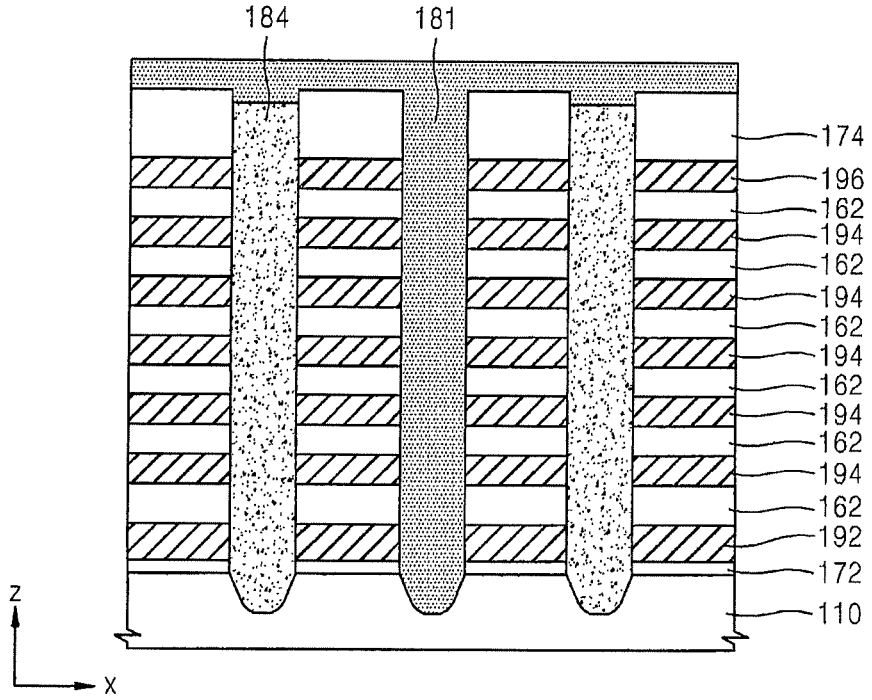

Referring to FIG. 12, the sacrificial material layer 184 filled in a portion of the channel hole recess region CHR may be removed, and a sacrificial insulating material layer 181 may be filled in the portion.

That is, some of the plurality of channel hole recess regions CHR may be covered with an etch mask, and a channel hole recess region CHR formed in a space that becomes a word line recess region WLR (see FIG. 15) in a subsequent process may be exposed to remove the first sacrificial material layer 184. Only a first sacrificial material formed in the channel hole recess region CHR in which the word line recess region WLR is to be formed may be selectively removed by using an etchant having an etch selectivity, which may etch only the first sacrificial material layer 184, to expose the upper surface of the substrate 110 in which the word line recess region WLR is to be formed. In the present embodiment, the first sacrificial material layer 184 may be formed of a conductive material, such as SOG, SOH, SiGe, or the like, and thus, an etchant that may selectively etch only the conductive material may be used.

After removing the first sacrificial material layer 184 formed so as to cover an upper surface of the upper insulating layer 174, the channel hole recess region CHR in which the word line recess region WLR is to be formed is filled with the sacrificial insulating material layer 181. Chemical mechanical polishing (CMP) may be performed on the first sacrificial material layer 184 formed on the upper insulating layer 174 to expose the upper surface of the first sacrificial material layer 184 so that the level of the upper surface of the first sacrificial material layer 184 is lower than that of the upper surface of the upper insulating layer 174. Next, the sacrificial insulating material layer 181 is formed to fill a portion of the channel hole recess region CHR, in which the word line recess region WLR is to be formed, and to cover the upper surface of the upper insulating layer 174. The sacrificial insulating material layer 181 may include an insulating material such as silicon oxide ($SiO_2$), silicon nitride (SiN or $Si_3N_4$), and/or silicon oxynitride (SiON). The sacrificial insulating material layer 181 may be formed by using a CVD process or an atomic layer deposition (ALD) process.

Figure 13:
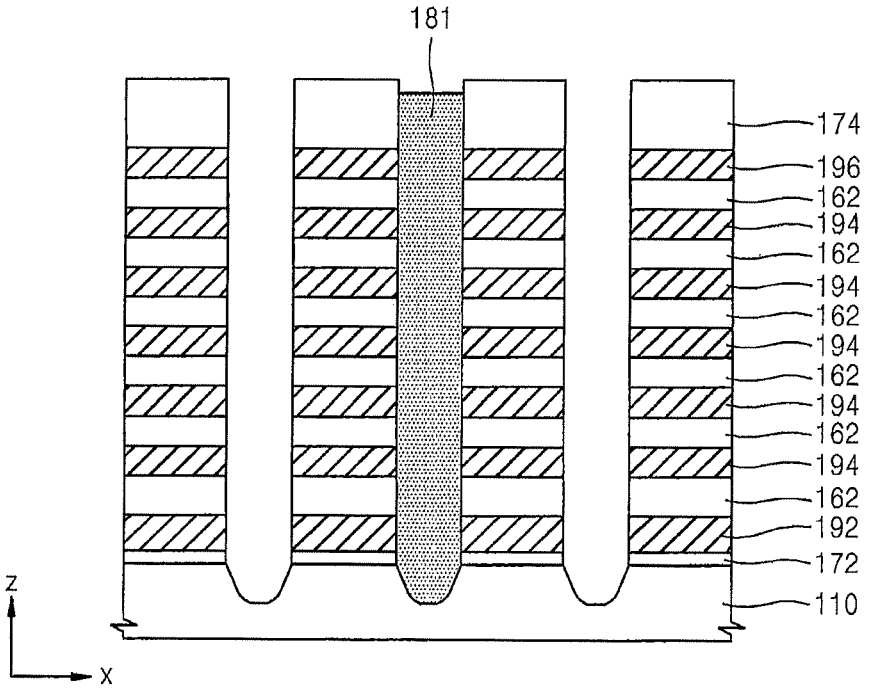

Referring to FIG. 13, after removing the sacrificial insulating material layer 181 formed on the upper insulating layer 174 to expose the upper surface of the first sacrificial material layer 184 and then removing the first sacrificial material layer 184, the upper surface of the sacrificial insulating material layer 181 is lowered through an etch back process or a CMP process. By performing processes according to the above-mentioned order, the level of the upper surface of the sacrificial insulating material layer 181 may be lower than that of the upper surface of the upper insulating layer 174. Only the first sacrificial material layer 184 formed in a channel hole recess region CHR that was not filled with the sacrificial insulating material layer 181 may be removed by using an etchant that may selectively etch the sacrificial insulating material layer 181, the first to third sacrificial layers 192, 194, and 196, and the interlayer insulating layer 162. In the present embodiment, the first sacrificial material layer 184 may be formed of a material, such as SOG, SOH, SiGe, or the like, and thus, an etchant that may selectively etch only the material may be used.

After removing the first sacrificial material layer 184, CMP may be performed on the sacrificial insulating material layer 181 formed on the upper insulating layer 174 so that the level of the upper surface of the sacrificial insulating material layer 181 is lower than that of the upper surface of the upper insulating layer 174.

Figure 14:
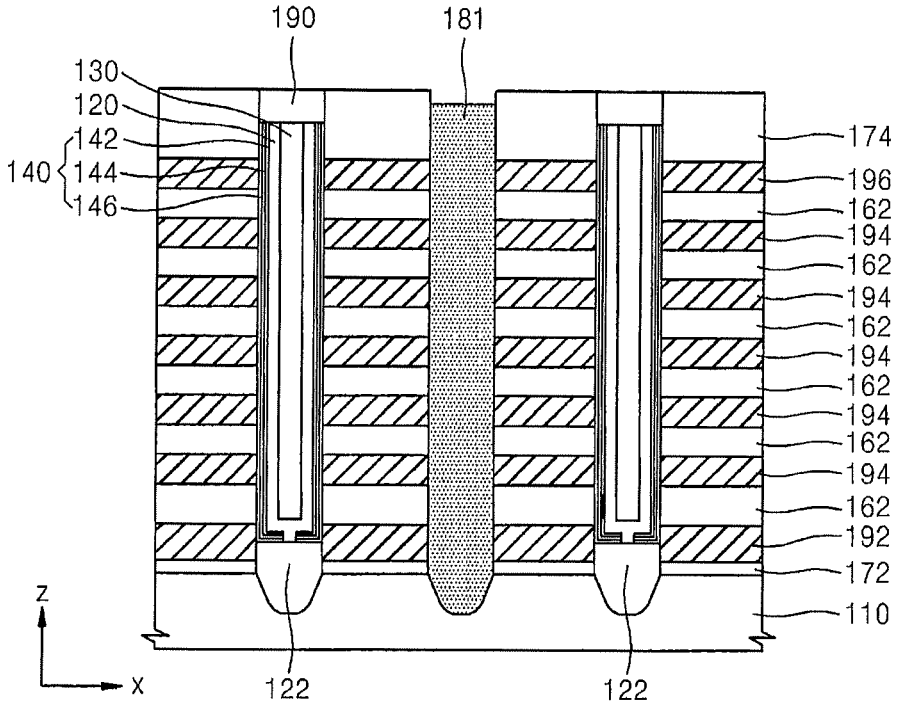

Referring to FIG. 14, a channel structure may be formed in the channel hole recess region CHR emptied due to the removal of the first sacrificial material layer 184.

A channel contact 122 is formed on the upper surface of the substrate 110 in which the channel hole recess region CHR was formed. The channel contact 122 may be formed of a conductor including a doped polysilicon. In the present embodiment, the channel contact 122 may be formed by using a silicon epitaxial growth (SEG) process. A gate dielectric layer 140 may be formed by sequentially depositing a blocking insulating layer 146, a charge storage layer 144, and a tunneling insulating layer 142 on the upper surface of the channel contact 122 and the sidewall of an opening of the channel hole recess region CHR. In the present embodiment, the tunneling insulating layer 142, the charge storage layer 144, and the blocking insulating layer 146 may be formed by using any one process selected from among the ALD process and the CVD process. For example, the tunneling insulating layer 142 may be formed of $SiO_2$, $Si_3N_4$, SiON, $HfO_2$, $HfSi_xO_y$, $Al_2O_3$, and/or $ZrO_2$. The charge storage layer 144 may be formed of silicon nitride or polysilicon, and may also include quantum dots or nanocrystals. The blocking insulating layer 146 may include a high dielectric constant material. For example, the blocking insulating layer 146 may include $HfO_2$, $ZrO_2$, $Al_2O_3$, tantalum oxide ($Ta_2O_5$), yttrium oxide $Y_2O_3$, or a combination thereof.

A channel region 120 may be formed at the sidewall of the charge storage layer 144 of the channel hole recess region CHR. The channel region 120 may be conformally formed on the sidewall of the charge storage layer 144 so as to have a predetermined thickness, and thus the channel hole recess region CHR may not be completely buried. The channel region 120 may be formed in an annular shape. In the present embodiment, the channel region 120 may be formed of a conductive material, such as polysilicon doped with impurities or the like. For example, the impurities may be P-type impurities such as arsenic (As) or N-type impurities such as boron (B). The impurities may be in-situ doped in the process of forming the channel region 120 or may be injected into the channel region 120 by using an ion-implantation process.

A buried insulating layer 130 filling an internal empty or unobstructed space of the channel region 120 formed in an annular shape may be formed. In the present embodiment, the buried insulating layer 130 may be formed by forming an insulating material, which fills the channel hole recess region CHR, and then performing a CMP process and/or an etch-back process on the insulating material. The upper surface of the buried insulating layer 130 may be lower than that of the upper insulating layer 174, and thus, an upper portion of the channel hole recess region CHR may not be filled. The upper surface of the buried insulating layer 130 may be higher than that of the third sacrificial layer 196. In an etch-back process for forming the buried insulating layer 130, an upper portion of the channel region 120 formed in a sidewall uppermost portion of the channel hole recess region CHR may be removed. Accordingly, the level of the upper surface of the channel region 120 may be the same as that of the upper surface of the buried insulating layer 130.

A conductive layer 190 filling the channel hole recess region CHR may be formed on the channel region 120 and the buried insulating layer 130. The conductive layer 190 may be formed by forming a conductive material on the channel region 120, the buried insulating layer 130, and the upper insulating layer 174 and then performing a planarization process on an upper portion of the conductive material until the upper surface of the upper insulating layer 174 is exposed. The conductive layer 190 may be formed of a conductive material such as polysilicon doped with impurities.

Figure 15:
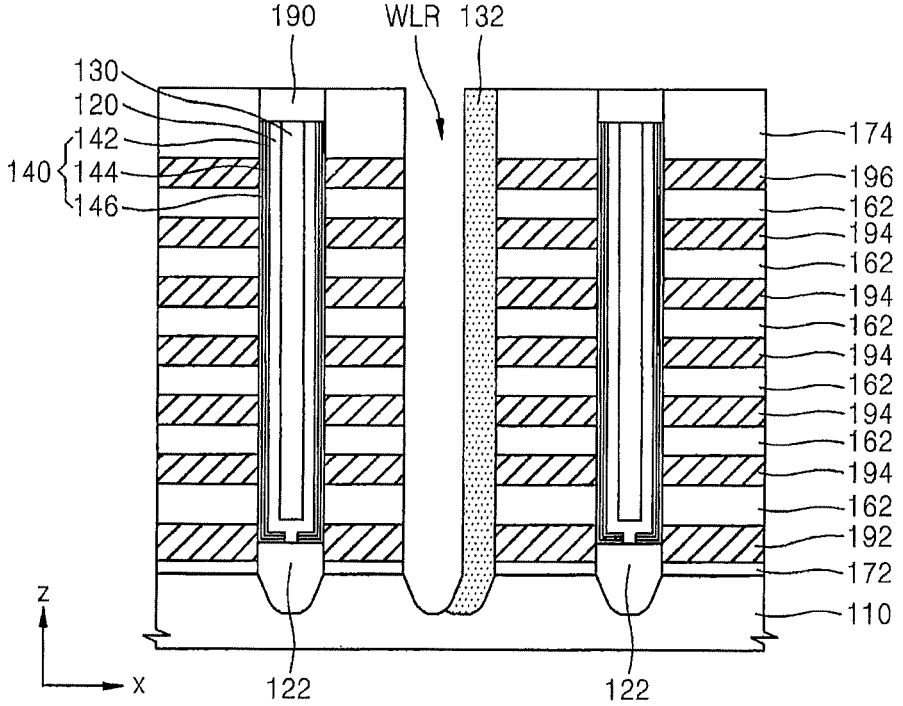

Referring to FIG. 15, the lower insulating layer 172, the upper insulating layer 174, and the first to third sacrificial layers 192, 194, and 196, which are positioned between adjacent channel structure, may be anisotropically etched to form a word line recess region WLR. The word line recess region WLR may be formed so as to extend in a direction perpendicular to the main surface of the substrate 110. Sidewalls of the upper and lower insulating layers 172 and 174 and sidewalls of the first to third sacrificial layers 192, 194, and 196 may be exposed due to the formation of the word line recess region WLR. The sacrificial insulating material layer 181 (see FIG. 14) may be etched and removed as the word line recess region WLR is formed. However, a portion of the sacrificial insulating material layer 181 may remain, and thus, an insulating pattern structure 132 may be formed.

Figure 16:
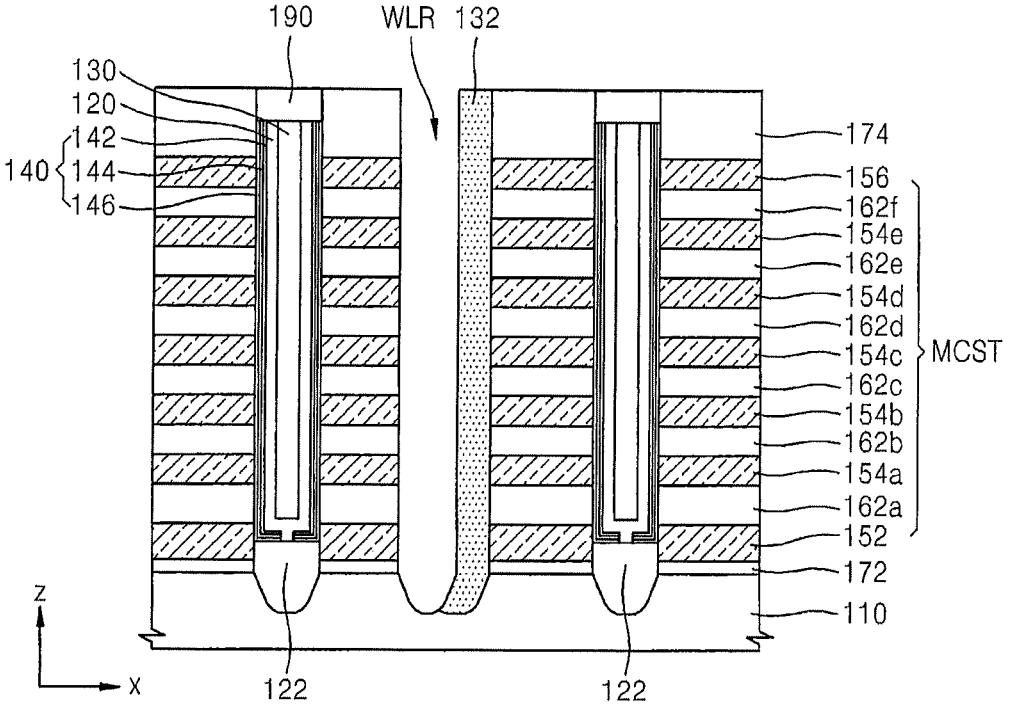

Referring to FIG. 16, by performing a silicification or silicidation process on the first to third sacrificial layers 192, 194, and 196 exposed by the word line recess region WLR, the first sacrificial layer 192 may be converted into a ground selection line 152, the second sacrificial layers 194 may be converted into a plurality of word lines 154a to 154e, and the third sacrificial layer 196 may be converted into a string selection line 156.

In the present embodiment, the ground selection line 152, the plurality of word lines 154a to 154e, and the string selection line 156 each may be formed of $TiSi_x$, $TaSi_x$, tungsten silicide $WSi_x$, cobalt silicide $CoSi_x$, and/or $NiSi_x$.

In the case of forming a dummy channel structure D (see FIG. 2) instead of forming the insulating pattern structure 132, a channel hole recess region CHR, in which the dummy channel structure D is to be formed, from among a plurality of channel hole recess regions CHR (see FIG. 10) may be anisotropically etched, as described with reference to FIG. 15, and then one side of the dummy channel structure D exposed through a sidewall of the channel hole recess region CHR may be oxidized to form the nonvolatile memory device 100 illustrated in FIG. 2.

Figure 17A:
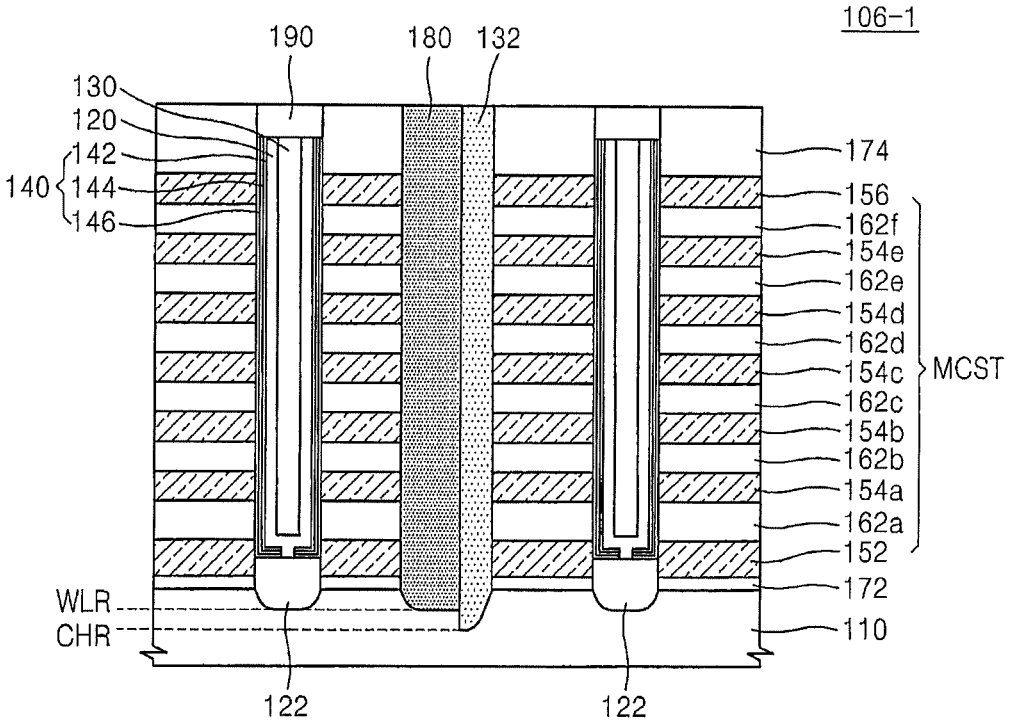
FIGS. 17A and 17B each are a cross-sectional view of a main part of the nonvolatile memory device illustrated in FIGS. 10 to 16, according to embodiments of the inventive concepts.
Figure 17B:
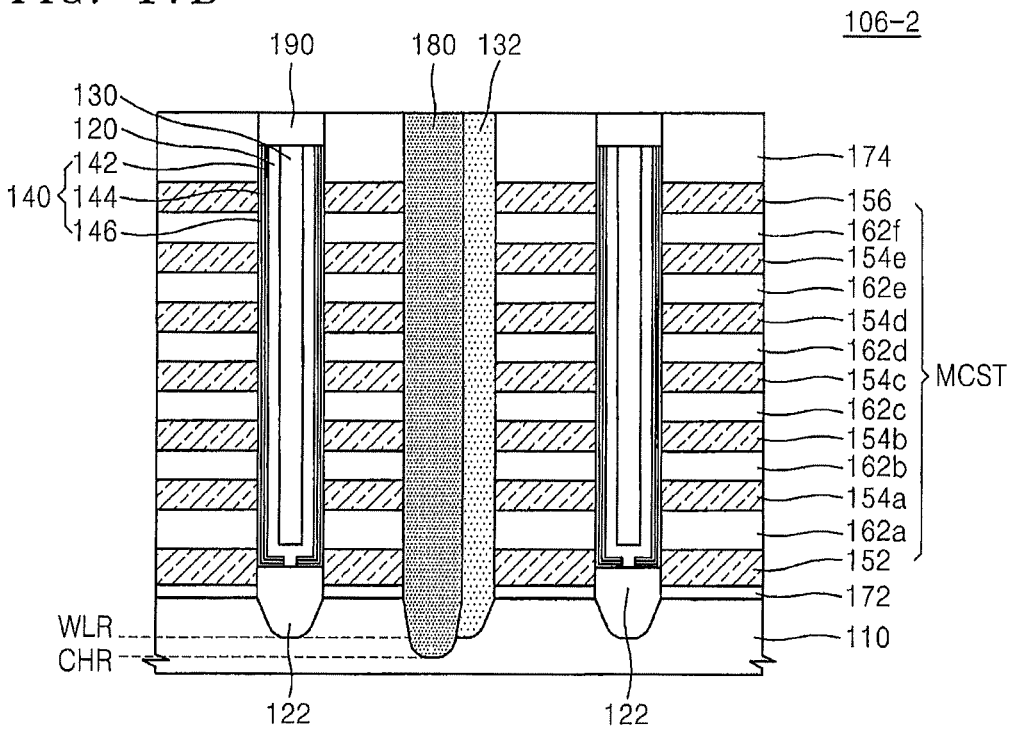

FIGS. 17A and 17B are cross-sectional views showing a relative height of an insulating pattern structure 132 formed on a substrate 110 in the process of forming a word line recess region WLR (see FIG. 15).

Referring to FIGS. 17A and 17B, the level of a recessed upper surface of the substrate 110 in which the insulating pattern structure 132 was formed is different between the cross-sectional view of FIG. 17A and the cross-sectional view of FIG. 17B. In a nonvolatile memory device 106-1 according to some embodiments of the inventive concepts, the level of a recessed upper surface of the substrate 110 on which a common source line 180 was formed may be higher than that of an upper surface of the substrate 110 on which the insulating pattern structure 132 was formed. In a nonvolatile memory device 106-2 according to further embodiments of the inventive concepts, the level of a recessed upper surface of the substrate 110 on which a common source line 180 was formed may be lower than that of an upper surface of the substrate 110 on which the insulating pattern structure 132 was formed. This is because the common source line 180 filling the word line recess region WLR is formed after forming the sacrificial insulating layer 181 and then forming the word line recess region WLR through an etch process, as described with reference to FIGS. 10 to 16. In the process of forming the word line recess region WLR described with reference to FIG. 15, the level of a recessed upper surface of the substrate 110 on which the word line recess region WLR is formed may be different from that of a recessed upper surface of the substrate 110 on which the insulating pattern structure 132 is formed, according to the degree of an anisotropic etch.

Figure 18:
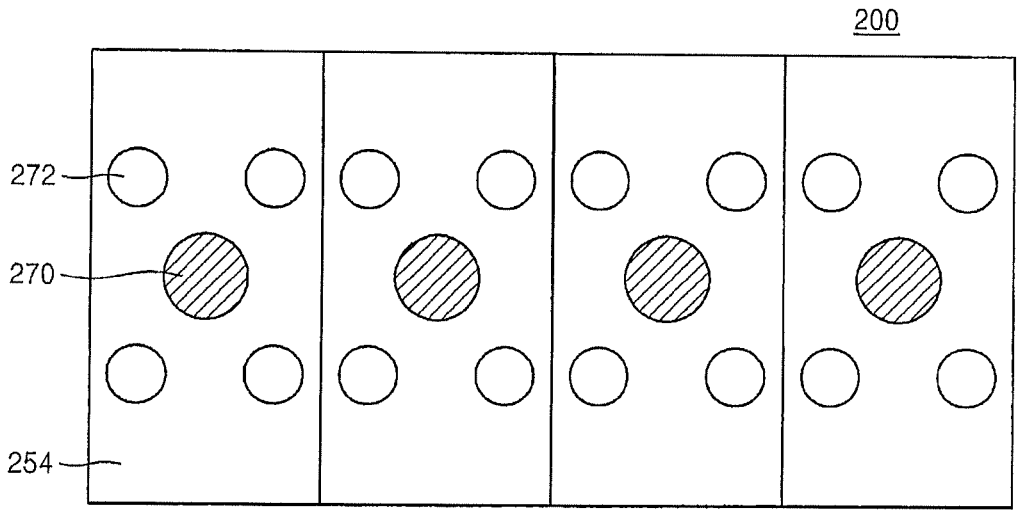
FIG. 18 is a plan view illustrating a stacked structure of a word line structure of a nonvolatile memory device, according to some embodiments of the inventive concepts.
Figure 19:
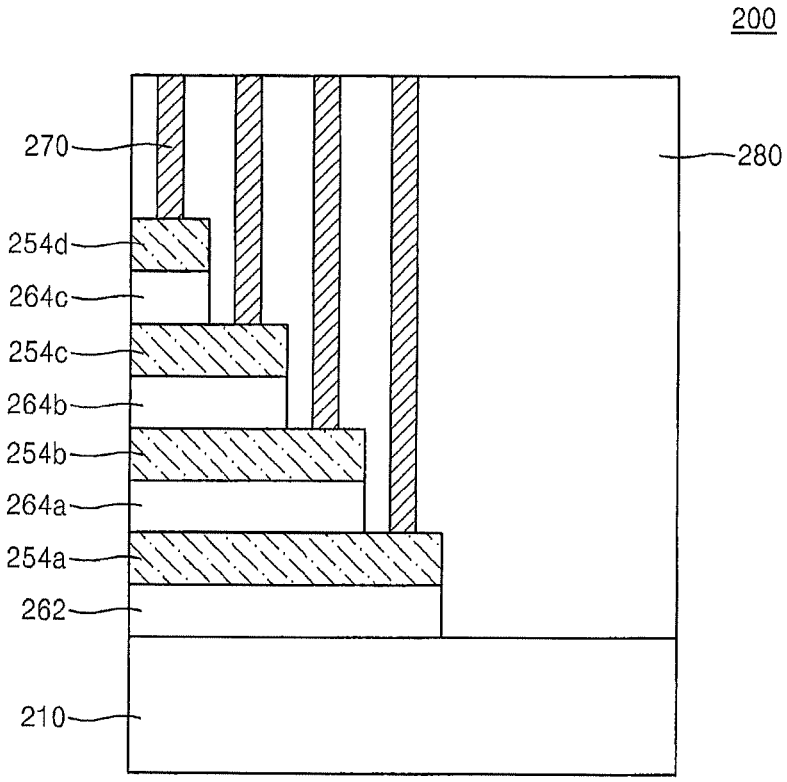
FIG. 19 is a cross-sectional view of a word line region of the nonvolatile memory device illustrated in FIG. 18.

FIG. 18 is a plan view illustrating a stacked structure of a word line structure of a nonvolatile memory device 200, according to some embodiments of the inventive concepts. FIG. 19 is a cross-sectional view of the stacked structure illustrated in FIG. 18.

Referring to FIG. 18, a word line contact 270 may be formed on a word line structure 254, and a plurality of dummy contacts 272 may be formed adjacent to the word line contact 270. The plurality of dummy contacts 272, which support a plurality of word line structures 254a to 254d (see FIG. 19), may be formed around or adjacent a periphery of the word line contact 270. Although four dummy contacts in FIG. 18 are formed in four positions around the periphery of the word line contact 270, that is, in right upper and lower sides of the word line contact 270 and left upper and lower sides of the word line contact 270, the positions of the plurality of dummy contacts 272 are not limited thereto. In addition, the number of dummy contacts 272 that are formed around the word line contact 270 is not limited to four, but may be from one or more.

Referring to FIG. 19, the plurality of word line structures 254a to 254d are stacked in a step form in a direction perpendicular to a main surface of a substrate 210 of the nonvolatile memory device 200 and are separate from each other by a predetermined distance, and a plurality of word line contacts 270 are connected to the plurality of word line structures 254a to 254d, respectively. A plurality of interlayer insulating layers 264a to 264c are formed between the plurality of word line structures 254a to 254d. The plurality of word line contacts 270 may support the stacked structure including the plurality of word line structures 254a to 254d and may be used for connection to peripheral circuits. In the plurality of word line structures 254a to 254d, a plurality of dummy contacts 272 may be formed adjacent to the plurality of word line contacts 270. The plurality of dummy contacts 272 may reduce or prevent the stacked structure including the plurality of word line structures 254a to 254d from collapsing. The stacked structure, which includes the plurality of word line structures 254a to 254d and also includes the plurality of interlayer insulating layers 264a to 264c, and the plurality of word line contacts 270 may be covered with an insulating layer 280.

The plurality of dummy contacts 272 may be formed by using manufacturing methods as described in the process (see FIGS. 7 to 11) of forming the dummy channel structure D of the nonvolatile memory device 102 illustrated in FIG. 6. That is, each of the plurality of dummy contacts 272 may be formed as a dummy channel structure or may be filled with an insulating material. In the present embodiment, the plurality of dummy contacts 272 may be formed of an insulating material such as $SiO_2$, $Si_3N_4$, and/or SiON.

Figure 20:
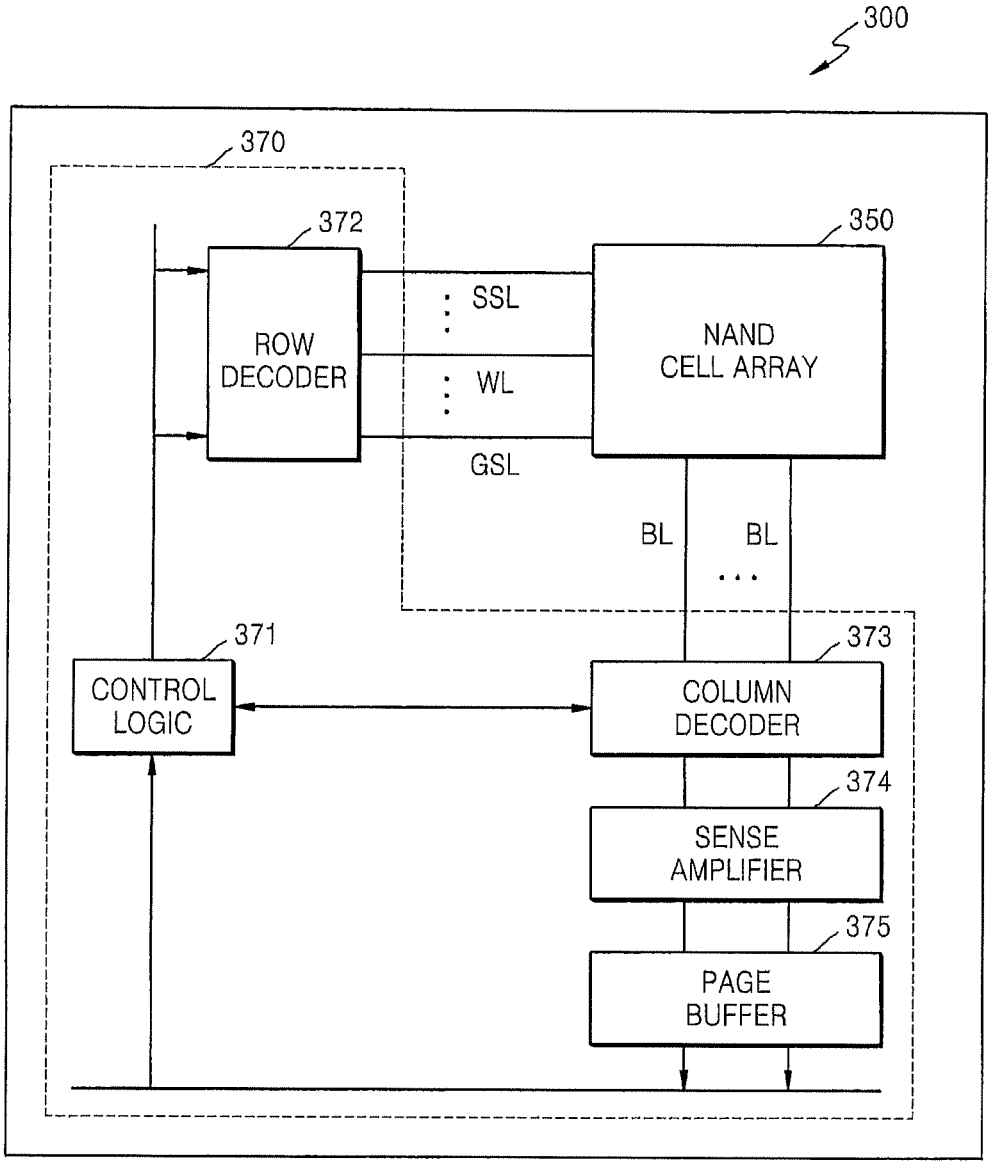
FIG. 20 is a block diagram of a nonvolatile memory device according to further embodiments of the inventive concepts.

FIG. 20 is a schematic block diagram of a nonvolatile memory device 300 according to further embodiments of the inventive concepts.

Referring to FIG. 20, in the nonvolatile memory device 300, a NAND cell array 350 may be connected to a core circuit unit 370. For example, the NAND cell array 350 may include any of the nonvolatile memory devices 100, 102, 104, 106-1, 106-2, 108-1, 108-2, and 108-3 illustrated in FIGS. 2, 6, 14, 16, and 17. The core circuit unit 370 may include a control logic 371, a row decoder 372, a column decoder 373, a sense amplifier 374, and a page buffer 375.

The control logic 371 may communicate with the row decoder 372, the column decoder 373, and the page buffer 375. The row decoder 372 may communicate with the NAND cell array 350 through a plurality of string selection lines SSL, a plurality of word lines WL, and a plurality of ground selection lines GSL. The column decoder 373 may communicate with the NAND cell array 350 through a plurality of bit lines BL. The sense amplifier 374 may be connected to the column decoder 373 when a signal is output from the NAND cell array 350, and may not be connected to the column decoder 373 when a signal is transferred to the NAND cell array 350.

For example, the control logic 371 may transfer a row address signal to the row decoder 372, and the row decoder 372 may decode the row address signal and transfer the decoded row address signal to the NAND cell array 350 through the string selection lines SSL, the word lines WL, and the ground selection lines GSL. The control logic 371 may transfer a column address signal to the column decoder 373 or the page buffer 375, and the column decoder 373 may decode the column address signal and transfer the decoded column address signal to the NAND cell array 350 through the bit lines BL. A signal of the NAND cell array 350 may be transferred to the sense amplifier 374 through the column decoder 373 and amplified by the sense amplifier 374, and the amplified signal may be transferred to the control logic 371 through the page buffer 375.

Figure 21:
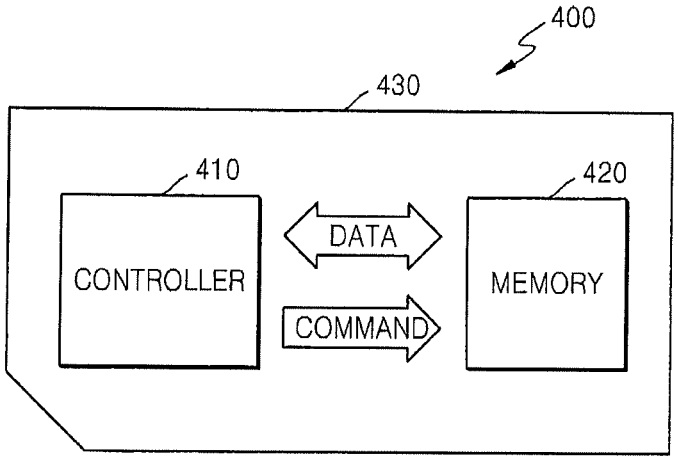
FIG. 21 is a block diagram of a memory card according to some embodiments of the inventive concepts.

FIG. 21 is a block diagram of a memory card 400 according to some embodiments of the inventive concepts.

Referring to FIG. 21, the memory card 400 may include a controller 410 and a memory 420 that are installed in a housing 430. The controller 410 and the memory 420 may exchange electrical signals with each other. For example, the memory 420 and the controller 410 may exchange data with each other according to a command of the controller 410. Accordingly, the memory card 400 may store data in the memory 420 or output data from the memory 420 to the outside.

For example, the memory 420 may include any one of the nonvolatile memory devices 100, 102, 104, 106-1, and 106-2 illustrated in FIGS. 2, 6, 9, 17A, and 17B. The memory card 400 may be used as a data storage medium of various portable devices. For example, the memory card 400 may include a multimedia card (MMC) or a secure digital card (SD).

Figure 22:
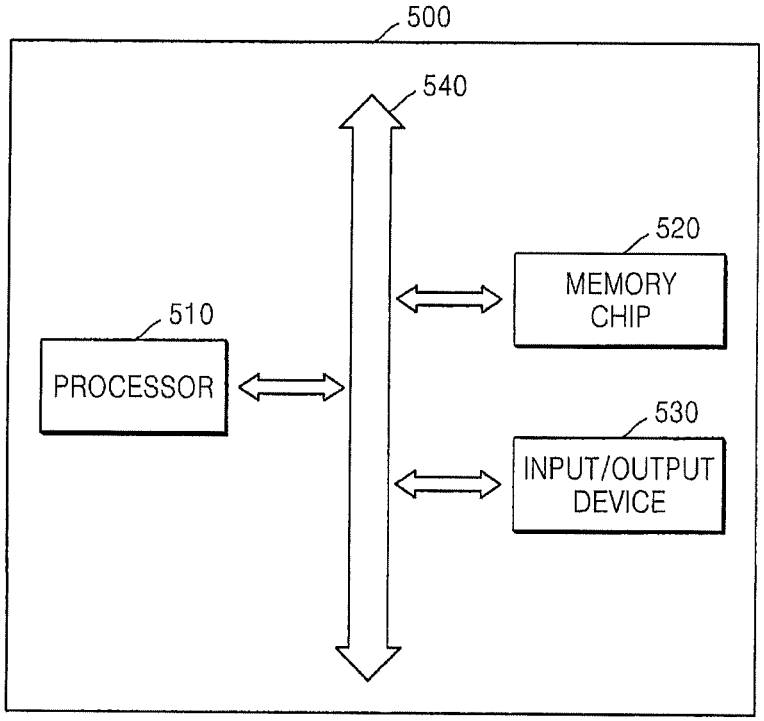
FIG. 22 is a block diagram of an electronic system according to some embodiments of the inventive concepts.

FIG. 22 is a block diagram of an electronic system 500 according to some embodiments of the inventive concepts.

Referring to FIG. 22, the electronic system 500 may include a processor 510, an input/output device 530, and a memory chip 520 that may exchange data with each other through a bus 540. The processor 510 may execute a program and control the electronic system 500. The input/output device 530 may be used to input or output data of the electronic system 500. By using the input/output device 530, the electronic system 500 may be connected to an external device, for example, a personal computer or a network to exchange data with the external device. The memory chip 520 may store codes and data for operation of the processor 510. For example, the memory chip 520 may include any one of the nonvolatile memory devices 100, 102, 104, 106-1, and 106-2 illustrated in FIGS. 2, 6, 9, 17A, and 17B.

The electronic system 500 may constitute or define various electronic control devices that need the memory chip 520. For example, the electronic system 500 may be used in mobile phones, MP3 players, navigation devices, SSDs, and household appliances.

While the inventive concepts has been particularly shown and described with reference to exemplary embodiments thereof, it will be understood that various changes in form and details may be made therein without departing from the spirit and scope of the following claims.

What is claimed is:

1. A vertical-type nonvolatile memory device, comprising:

a substrate;

a channel structure extending in a first direction perpendicular to the substrate;

a plurality of memory cell stacks respectively comprising a ground selection line, a plurality of word lines, and a string selection line, wherein the ground selection line, the plurality of word lines, and the string selection line are sequentially stacked so as to be separate from each other on a side surface of the channel structure in the first direction;

a common source region on a first surface of the substrate between ones of the plurality of memory cell stacks;

a recess region, which has a bottom corresponding to a second surface lower than the first surface of the substrate, in the substrate, the recess region comprising a first channel material layer therein; and a dummy channel structure contacting a sidewall of the common source region and overlapping a portion of an upper surface of the first channel material layer in the first direction.

2. The vertical-type nonvolatile memory device of claim 1, wherein the upper surface of the first channel material layer is higher than an upper surface of the substrate on which the common source region is provided.

3. The vertical-type nonvolatile memory device of claim 1, wherein the first channel material layer contacts the sidewall of the common source region.

4. The vertical-type nonvolatile memory device of claim 1, wherein a channel hole recess region, which is lower than the bottom of the recess region, is provided on the substrate.

5. A vertical-type nonvolatile memory device, comprising:

a substrate;

a channel structure extending from the substrate in a first direction perpendicular to the substrate;

a plurality of memory cell stacks respectively comprising a ground selection line, a plurality of word lines, and a string selection line, wherein the ground selection line, the plurality of word lines, and the string selection line are sequentially stacked so as to be separate from each other on a side surface of the channel structure in the first direction;

a [common source] *word line recess* region on a first surface of the substrate between ones of the plurality of memory cell stacks, *wherein the first surface is lower than an upper surface of the substrate*; and a *channel hole* recess region, which has a bottom corresponding to a second surface lower than the first surface of the substrate, in the substrate[, and further comprising: a channel hole recess region, which is lower than the bottom of the recess region, on the substrate; or a channel hole protruding portion, which is higher than the bottom of the recess region and is lower than an upper surface of the substrate, on the substrate].

6. A vertical-type nonvolatile memory device, comprising:

a substrate;

a channel structure extending from the substrate in a first direction perpendicular to the substrate;

a plurality of word lines sequentially stacked [so as to be] spaced apart from each other along a side surface of the channel structure in the first direction;

a [common source] *word line recess* region [between stacks of] *having a first width to separate* the plurality of word lines *into a first stack of the plurality of word lines and a second stack of the plurality of word lines*; and at least one dummy channel structure adjacent a sidewall of the [common source] *word line recess* region, wherein the at least one dummy channel structure is disposed between the channel structure and the [common source] *word line recess* region[, wherein a distance between the at least one dummy channel structure and the channel structure on a word line closest to the at least one dummy channel structure is larger than a distance between the channel structure and another channel structure on the word line] *wherein the at least one dummy channel structure comprises a plurality of dummy channel structures each having a respective width that is less than the first width and that are disposed consecutively in a line along the word line recess region in a second direction perpendicular to the first direction.*

[7. The vertical-type nonvolatile memory device of claim 6, wherein the at least one dummy channel structure comprises a plurality of dummy channel structures that are disposed in a line in a second direction perpendicular to the first direction.]

8. [The vertical-type nonvolatile memory device of claim 6] *A vertical-type nonvolatile memory device, comprising:*

*a substrate;*

*a channel structure extending from the substrate in a first direction perpendicular to the substrate;*

*a plurality of word lines sequentially stacked spaced apart from each other along a side surface of the channel structure in the first direction;*

*a word line recess region having a first width to separate the plurality of word lines into a first stack of the plurality of word lines and a second stack of the plurality of word lines; and*

*at least one dummy channel structure adjacent a sidewall of the word line recess region, wherein the at least one dummy channel structure is disposed between the channel structure and the word line recess region wherein the at least one dummy channel structure comprises a plurality of dummy channel structures each having a respective width that is less than the first width, and* wherein the at least one dummy channel structure comprises [a channel layer and] a charge storage layer, wherein a surface of the at least one dummy channel structure, which faces the [common source] *word line recess* region, is covered with a blocking insulating layer.

9. The vertical-type nonvolatile memory device of claim 6, wherein the at least one dummy channel structure comprises a dummy hole defining an unobstructed space therein.

10. The vertical-type nonvolatile memory device of claim 6, wherein an inside of the at least one dummy channel structure comprises an insulating material.

11. The vertical-type nonvolatile memory device of claim 10, further comprising a plurality of word line contacts on the plurality of word lines and connected to the plurality of word lines, respectively, wherein the dummy channel structure is disposed adjacent a periphery of the plurality of word line contacts.

12. The vertical-type nonvolatile memory device of claim 6, wherein the [common source] *word line recess* region is on a first surface of the substrate, and the at least one dummy channel structure is on a second surface having a level that is different from that of the first surface of the substrate.

13. A vertical-channel nonvolatile memory device, comprising:

a substrate including channel hole recess regions in a surface thereof;

channel structures vertically protruding from the surface of the substrate on ones of the channel hole recess regions;

memory cell stacks comprising insulating and conductive layers alternately stacked along sidewalls of the channel structures; and a common source line extending along the surface of the substrate on other ones of the channel hole recess regions in a word line recess region that separates adjacent ones of the memory cell stacks, wherein a distance between the ones of the channel hole recess regions having the channel structures thereon and the other ones of the channel hole recess regions immediately adjacent thereto is greater than a distance between the ones of the channel hole recess regions immediately adjacent one another.

14. The device of claim 13, further comprising:

non-functional channel contact structures comprising a channel material layer in the other ones of the channel hole recess regions.

15. The device of claim 14, further comprising:

non-functional dummy channel structures vertically protruding from the substrate surface on the other ones of the channel hole recess regions adjacent sidewalls of the common source line.

16. The device of claim 13, wherein respective surfaces of the word line recess region and the other ones of the channel hole recess regions are non-coplanar.

*17. A vertical-type nonvolatile memory device, comprising:*

*a substrate extending in a first direction and in a second direction;*

*a first word line plate extending in the first and second directions on the substrate;*

*a second word line plate extending in the first and second directions on the substrate, the second word line plate spaced apart from the first word line plate in the first direction;*

*a plurality of first vertical channel structures aligned with one another in the second direction in the first word line plate;*

*a plurality of second vertical channel structures aligned with one another in the second direction in the second word line plate and directly adjacent to the plurality of first vertical channel structures; and*

*a word line recess region extending in the second direction to separate the first and second word line plates from one another and to alternatingly intersect one of the plurality of first vertical channel structures and one of the plurality of second vertical channel structures.*

*18. A vertical-type nonvolatile memory device, comprising:*

*a substrate extending in a first direction and in a second direction;*

*a first word line plate extending in the first and second directions on the substrate;*

*a second word line plate extending in the first and second directions on the substrate, the second word line plate spaced apart from the first word line plate in the first direction;*

*a plurality of first vertical channel structures in the first word line plate aligned with one another in a diagonal direction relative to the first and second directions;*

*a plurality of second vertical channel structures in the second word line plate aligned with one another in the diagonal direction; and*

*a word line recess region extending in the second direction to separate the first and second word line plates from one another and to intersect ones of the plurality of first vertical channel structures and ones of the plurality of second vertical channel structures that are directly adjacent to one another,*

*wherein the intersected ones of the plurality of first vertical channel structures and intersected ones of the plurality of second vertical channel structures are semi-circular from a plan view, and other ones of the plurality of first vertical channel structures and plurality of second vertical channel structures are not intersected by the word line recess region and are circular from a plan view.*

*19. A vertical-type nonvolatile memory device, comprising:*

*a substrate extending in a first direction and in a second direction;*

*a first word line plate extending in the first and second directions on the substrate;*

*a second word line plate extending in the first and second directions on the substrate, the second word line plate spaced apart from the first word line plate in the first direction;*

*a plurality of first vertical channel structures aligned with one another in the second direction in first word line plate;*

*a plurality of second vertical channel structures aligned with one another in the second direction in the second word line plate, the plurality of second vertical channel structures directly adjacent to the plurality of first vertical channel structures and the plurality of second vertical channel structures offset from the plurality of first vertical channel structures in the second direction; and*

*a word line recess region extending in the second direction to separate the first and second word line plates from one another, wherein the word line recess region intersects the plurality of first vertical channel structures and the plurality of second vertical channel structures.*

*20. The vertical-type nonvolatile memory device of claim 19 wherein the word line recess region includes an insulating material.*

*21. The vertical-type nonvolatile memory device of claim 19 wherein the first word line plate comprises a plurality of first word line plates vertically stacked on one another and the second word line plate comprises a plurality of second word line plates vertically stacked on one another; and wherein the word line recess region extends toward the substrate to separate the plurality of first word line plates from the plurality of second word line plates.*

*22. The vertical-type nonvolatile memory device of claim 19 wherein the plurality of first vertical channel structures comprises a plurality of first dummy vertical channel structures and the plurality of second vertical channel structures comprises a plurality of second dummy vertical channel structures.*

*23. The vertical-type nonvolatile memory device of claim 19 wherein each of the plurality of first vertical channel structures comprises a first semi-circular shaped vertical channel structure and wherein each of the plurality of second vertical channel structures comprises a second semi-circular shaped vertical channel structure.*

*24. The vertical-type nonvolatile memory device of claim 22 wherein each of the first and second dummy vertical channel structures comprises a charge storage layer, wherein a surface facing the word line recess region is covered with a blocking insulating layer.*

*25. A vertical-type nonvolatile memory device, comprising:*

*a substrate extending in a first direction and in a second direction;*

*a first word line plate extending in the first and second directions on the substrate;*

*a second word line plate extending in the first and second directions on the substrate, the second word line plate spaced apart from the first word line plate in the first direction;*

*a plurality of first vertical channel structures aligned with one another in the second direction in first word line plate;*

*a plurality of second vertical channel structures aligned with one another in the second direction in the second word line plate; and*

*a word line recess region extending in the second direction to separate the first and second word line plates from one another,*

*wherein the plurality of first vertical channel structures are directly adjacent to the plurality of second vertical channel structures with the word line recess region therebetween, and the plurality of first vertical channel structures are offset from the plurality of second vertical channel structures in the second direction, and a cross-section of each of the plurality of first vertical channel structures is semicircular in a plan view and a cross-section of each of the plurality of second vertical channel structures is semicircular in the plan view.*

*26. A vertical-type nonvolatile memory device, comprising:*

*a substrate extending in a first direction and in a second direction;*

*a first word line plate extending in the first and second directions on the substrate;*

*a second word line plate extending in the first and second directions on the substrate, the second word line plate spaced apart from the first word line plate in the first direction;*

*a first vertical channel structure and a second vertical channel structure aligned with one another in the second direction in first word line plate;*

*a third vertical channel structure in the second word line plate; and*

*a word line recess region extending in the second direction to separate the first and second word line plates from one another,*

*wherein the first vertical channel structure and the second vertical channel structure contact a first side wall of the word line recess region and the third vertical channel structure contacts a second side wall of the word line recess region that is opposite the first side wall, the third vertical channel structure overlaps the first vertical channel structure and the second vertical channel structure in the first direction, and a cross-section of the first, the second and the third vertical channel structure is semicircular in a plan view.*

* * * * *